United States Patent
Taki

(10) Patent No.: US 11,539,372 B2
(45) Date of Patent: Dec. 27, 2022

(54) SIGNAL CONTROL DEVICE

(71) Applicant: DENSO CORPORATION, Kariya (JP)

(72) Inventor: Masaya Taki, Kariya (JP)

(73) Assignee: DENSO CORPORATION, Kariya (JP)

( * ) Notice: Subject to any disclaimer, the term of this patent is extended or adjusted under 35 U.S.C. 154(b) by 1017 days.

(21) Appl. No.: 16/249,072

(22) Filed: Jan. 16, 2019

(65) Prior Publication Data

US 2019/0229746 A1 Jul. 25, 2019

(30) Foreign Application Priority Data

Jan. 22, 2018 (JP) .................................. JP2018-8051

(51) Int. Cl.
*H03M 1/12* (2006.01)
*B62D 5/04* (2006.01)
*H02P 27/06* (2006.01)

(52) U.S. Cl.
CPC ........ *H03M 1/1245* (2013.01); *B62D 5/0463* (2013.01); *B62D 5/0469* (2013.01); *B62D 5/0403* (2013.01); *H02P 27/06* (2013.01); *H03M 1/122* (2013.01); *H03M 1/1205* (2013.01)

(58) Field of Classification Search
CPC .. H03M 1/1245; H03M 1/1205; H03M 1/122; B62D 5/0463; B62D 5/0469; B62D 5/0403; H02P 27/06
See application file for complete search history.

(56) References Cited

U.S. PATENT DOCUMENTS

| 2010/0245141 A1* | 9/2010 | Ushie ................. H03M 1/1076 341/122 |
| 2012/0176141 A1 | 7/2012 | Mikami et al. |
| 2017/0155400 A1* | 6/2017 | Taki .................... H03M 1/1205 |

FOREIGN PATENT DOCUMENTS

JP 2017-096824 A 6/2017

* cited by examiner

*Primary Examiner* — Zoheb S Imtiaz
(74) *Attorney, Agent, or Firm* — Maschoff Brennan

(57) ABSTRACT

A signal control device includes a charge/discharge circuit, a sampling capacitor, and an AC conversion circuit. The charge/discharge circuit is capable of charging or discharging the sampling capacitor. The AC conversion circuit performs an AD conversion by converting an analog voltage value charged in the sampling capacitor into an AD conversion value that is a digital value. After a charge operation or a discharge operation to the sampling capacitor with the charge/discharge circuit, the AD conversion circuit performs the AD conversion, and a malfunction of the charge/discharge circuit is determined based on a diagnosis result of the AD conversion value.

10 Claims, 15 Drawing Sheets

FIG. 6

| No. | FAILURE MODE OF CHARGE/DISCHARGE CIRCUIT | FAILURE EXAMPLE | FAILURE DETECTION METHOD | | EXPECTED VALUE |
|---|---|---|---|---|---|
| | | | SWc | SWd | |
| 1 | CANNOT CHARGE CORRECTLY | OFF-FIXING OF SWc | ON | OFF | VALUE NEAR Vcc |
| 2 | ALWAYS CHARGE | ON-FIXING OF SWc | OFF | ON | VALUE NEAR GND |
| 3 | CANNOT DISCHARGE CORRECTLY | OFF-FIXING OF SWd | OFF | ON | VALUE NEAR GND |
| 4 | ALWAYS DISCHARGE | ON-FIXING OF SWd | ON | OFF | VALUE NEAR Vcc |
| 5 | ABNORMALITY IN CHARGE/DISCHARGE CHARACTERISTICS | CHANGE OF RESISTANCE VALUES OF Rc, Rd | ON | ON | VALUE NEAR Vc-d |
| 6 | COMBINATION OF ABOVE | ON-FIXING OF BOTH SWc AND SWd | COMBINATION OF ABOVE | | |

SIGNAL CONTROL DEVICE

CROSS REFERENCE TO RELATED APPLICATION

The present application claims the benefit of priority from Japanese Patent Application No. 2018-8051 filed on Jan. 22, 2018. The entire disclosure of the above application is incorporated herein by reference.

TECHNICAL FIELD

The present disclosure relates to a signal control device.

BACKGROUND

A conventional signal control device AD converts an analog signal input from a sensor into an AD conversion signal and uses the AD conversion signal for a control arithmetic operation. In the conventional signal control device, a technique for detecting a terminal malfunction such as an abnormal opening of a signal input terminal or an abnormal disconnection of a transmission path for an input signal has been known.

SUMMARY

A signal control device includes a charge/discharge circuit, a sampling capacitor, and an AC conversion circuit. The charge/discharge circuit is capable of charging or discharging the sampling capacitor. The AC conversion circuit performs an AD conversion by converting an analog voltage value charged in the sampling capacitor into an AD conversion value that is a digital value. After a charge operation or a discharge operation to the sampling capacitor with the charge/discharge circuit, the AD conversion circuit performs the AD conversion, and a malfunction of the charge/discharge circuit is determined based on a diagnosis result of the AD conversion value.

BRIEF DESCRIPTION OF THE DRAWINGS

Additional objects and advantages of the present disclosure will be more readily apparent from the following detailed description when taken together with the accompanying drawings. In the drawings:

FIG. 6 is a table showing failure modes and failure detection methods of a charge/discharge circuit;

DETAILED DESCRIPTION

Figure 1:
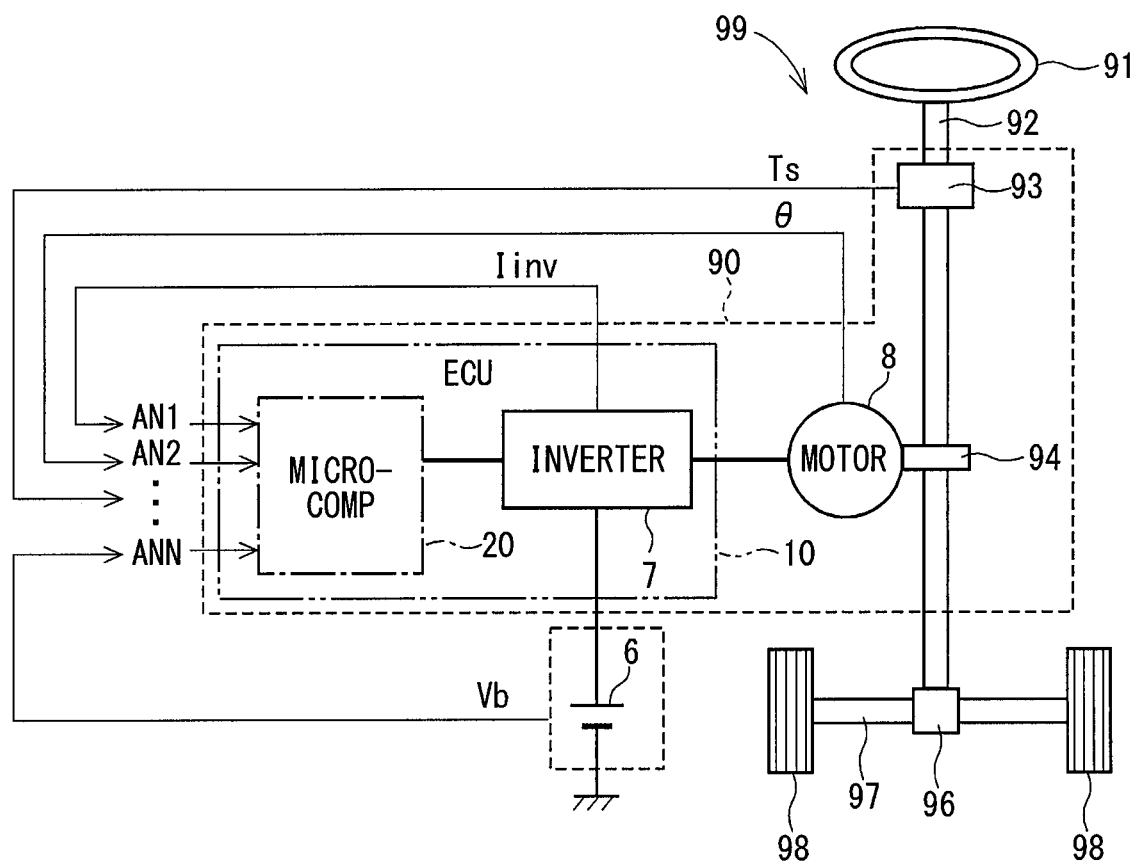
FIG. 1 is a schematic block diagram of an electric power steering system to which a signal control device according to each embodiment is applied.

A signal control device according to a related art includes a charge/discharge circuit in an AD converter, and the charge/discharge circuit can charge or discharge a sampling capacitor. The signal control device performs a "charge/discharge AD conversion" performed in a state where the charge/discharge circuit and the sampling capacitor are electrically connected, and an "input AD conversion" in a state where the charge/discharge circuit and the sampling capacitor are electrically disconnected at different timings. Then, the signal control device detects a terminal malfunction by switching electrical connection and electrical disconnection between the charge/discharge circuit and the sampling capacitor every AD conversion in a state where an input circuit and the sampling capacitor are electrically connected with each other.

The signal control device according to the related art can perform a control arithmetic operation using a correct AD conversion value obtained by the input AD conversion while constantly confirming that the AD converter is correctly operating. However, if a malfunction occurs in the charge/discharge circuit due to some cause, there is a possibility that the signal control device cannot charge/discharge correctly and misses a terminal malfunction to be detected.

A signal control device according to an aspect of the present disclosure includes a signal input terminal, a sampling capacitor, a charge/discharge circuit, an AD conversion circuit, a switch control circuit, and a malfunction determination section. The signal input terminal receives an input signal with a voltage value fluctuating within a predetermined fluctuation range from an input circuit. The sampling capacitor has one end connected to the signal input terminal via an input signal path and another end connected to a reference potential.

The charge/discharge circuit includes a charge path, a discharge path, a charge switch, and a discharge switch. The charge path is provided from a charge power supply end to a second connection point on the input signal path via a first connection point. The discharge path is provided from the second connection point to a reference potential end via the first connection point. The charge switch is capable of switching electrical connection and electrical disconnection between the charge path and the sampling capacitor and is capable of charging the sampling capacitor when the charge path and the sampling capacitor are electrically connected. The discharge switch is capable of switching electrical connection and electrical disconnection between the discharge path and the sampling capacitor and is capable of discharging the sampling capacitor when the discharge path and the sampling capacitor are electrically connected.

The AD conversion circuit performing an AD conversion by converting an analog voltage value charged in the sampling capacitor into an AD conversion value. The switch control circuit operates the charge switch and the discharge switch.

The malfunction determination section performs the AD conversion with the AD conversion circuit after performing a charge operation or a discharge operation to the sampling capacitor with the charge/discharge circuit, and determines a malfunction of the charge/discharge circuit based on a diagnosis result of the AD conversion value.

A signal control device according to another aspect of the present disclosure includes a signal input terminal, a sampling capacitor, a charge/discharge circuit, an AD conversion circuit, a switch control circuit, and a CPU. The signal input terminal receives an input signal with a voltage value fluctuating within a predetermined fluctuation range is input from an input circuit. The sampling capacitor has one end connected to the signal input terminal via an input signal path and another end connected to a reference potential.

The charge/discharge circuit includes a charge path, a discharge path, a charge switch, and a discharge switch. The charge path is provided from a charge power supply end to a second connection point on the input signal path via a first connection point. The discharge path is provided from the second connection point to a reference potential end via the first connection point. The charge switch is located on the charge path between the charge power supply end and the first connection point. The discharge switch is located on the discharge path between the first connection point and the reference potential.

The AD conversion circuit is electrically connected to the sampling capacitor and performs an AD conversion by converting an analog voltage value charged in the sampling capacitor into an AD conversion value that is a digital value. The switch control circuit is configured to turn on the charge switch and turn off the discharge switch in a charge operation to the sampling capacitor, and is configured to turn off the charge switch and turn on the discharge switch in a discharge operation to the sampling capacitor.

The CPU is communicatable with the AD conversion circuit and the switch control circuit via a bus. The CPU is configured to transmit a command to the AD conversion circuit to perform the AD conversion after transmitting a command to the switch control circuit to perform the charge operation or the discharge operation, and is configured to determine a malfunction of the charge/discharge circuit based on a diagnosis result of the AD conversion value.

The signal control devices having the above-described configurations can confirm the presence or absence of malfunction of the charge/discharge circuit. Thus, the signal control devices can be restricted from detecting a terminal malfunction in a state where the charge/discharge circuit does not operate correctly.

Hereinafter, embodiments of the present disclosure will be described with reference to the drawings. In the following embodiments, substantially identical elements have the same numerals, and description of the identical elements will not be repeated. The following first to third embodiments are collectively referred to as "present embodiments". First, with reference to FIG. 1, a schematic configuration of an electric power steering system in which a signal control device of each embodiment is commonly applied will be described. An electric power steering system 90 is a system that assists a steering torque of a driver by an output torque of an assist motor 8. Although the electric power steering system 90 shown in FIG. 1 is a column assist type, the signal control device can be similarly applied to a rack assist type electric power steering system.

A steering system 99 includes a steering wheel 91, a steering shaft 92, a pinion gear 96, a rack shaft 97, wheels 98, and the electric power steering system 90. The steering shaft 92 is connected to the steering wheel 91. The pinion gear 96 provided at an end of the steering shaft 92 engages with the rack shaft 97. A pair of wheels 98 is provided at both ends of the rack shaft 97 via, for example, tie rods. When the driver rotates the steering wheel 91, the steering shaft 92 connected to the steering wheel 91 rotates. A rotational motion of the steering shaft 92 is converted into a linear motion of the rack shaft 97 by the pinion gear 96 and the pair of wheels 98 is steered at an angle corresponding to a displacement amount of the rack shaft 97.

The electric power steering system 90 includes the assist motor 8, an ECU 10, a torque sensor 93, and a reduction gear 94. The assist motor 8 is, for example, a three-phase AC brushless motor. A rotation angle $\theta$ of the assist motor 8 is detected by a rotation angle sensor (not shown). The torque sensor 93 is provided at a portion of the steering shaft 92 and detects a steering torque Ts.

The ECU 10 as the signal control device includes a microcomputer (MICRO-COMP) 20, and an inverter 7. The inverter 7 converts a DC power of a battery 6 into an AC power based on an output command from the microcomputer 20 and supplies the AC power to the assist motor 8. An inverter current Iinv output from the inverter 7 is detected by a current sensor (not shown). Information on the inverter current Iinv and the rotation angle $\theta$ is used as a feedback signal in the microcomputer 20 for an output control of the assist motor 8.

The microcomputer 20 of the ECU 10 acquires information such as the steering torque Ts, the inverter current Iinv, the rotation angle $\theta$, and a battery voltage Vb basically as analog signals of the voltage value. In each of the embodiments, since it is not necessary to distinguish the types of individual input signals, various analog input signals are collectively referred to as "AN1, AN2, . . . , and ANN". For example, in a configuration in which each sensor is provided redundantly from the viewpoint of fail-safe, a plurality of signals of the same type may be input. Also, instead of acquiring all inputs as analog signals, some inputs may be acquired by other means such as digital communication.

Here, the third digit "1, 2, . . . , and N" is numbered sequentially for N input signals. Hereinafter, in the present disclosure, the same notation is used for reference numerals of other elements provided in correspondence with a plurality of input signals. In each of the embodiments, it is assumed that the number of N is plural, but it is also possible to assume that N=1, that is, the number of input signal input to the ECU 10 is one.

The microcomputer 20 calculates an assist amount to be output by the assist motor 8 by a control arithmetic operation based on the input signals AN1, AN2, . . . , and ANN, and outputs a drive signal corresponding the assist amount to to the inverter 7. As a result, energization of the assist motor 8 is controlled so that the assist motor 8 outputs a torque corresponding to the required assist amount. The assist torque generated by the assist motor 8 is transmitted to the steering shaft 92 via the reduction gear 94. Various processes in the ECU 10 may be software processes of a program already stored in a tangible memory device and executed by a CPU, or may be hardware processes executed by special electronic circuits. Further, the ECU 10 and the assist motor 8 may be integrally configured.

Next, a description will be given successively of the respective configurations of the ECUs 10 in the first to third embodiments, with emphasis on those of the microcomputers 20 included in the ECUs 10 and the AD converters in the microcomputers 20. In the following description of the individual embodiments, to distinguish the ECUs 10 and the microcomputers 20 in the first to third embodiments from each other, the reference numerals of the ECUs 10 and the microcomputers 20 in the first to third embodiments have additional numbers corresponding to the first to third embodiments at the third digits (that is, the third positions thereof from the left). For example, the reference numeral of the ECU in the first embodiment is "101". Likewise, general reference numerals of CPUs and AD converters in the microcomputers 20 are "30" and "40" and have additional numbers corresponding to the first to third embodiments at the third digit to distinguish the CPUs and the AD converters in the first to third embodiments from each other.

First Embodiment

Figure 2:
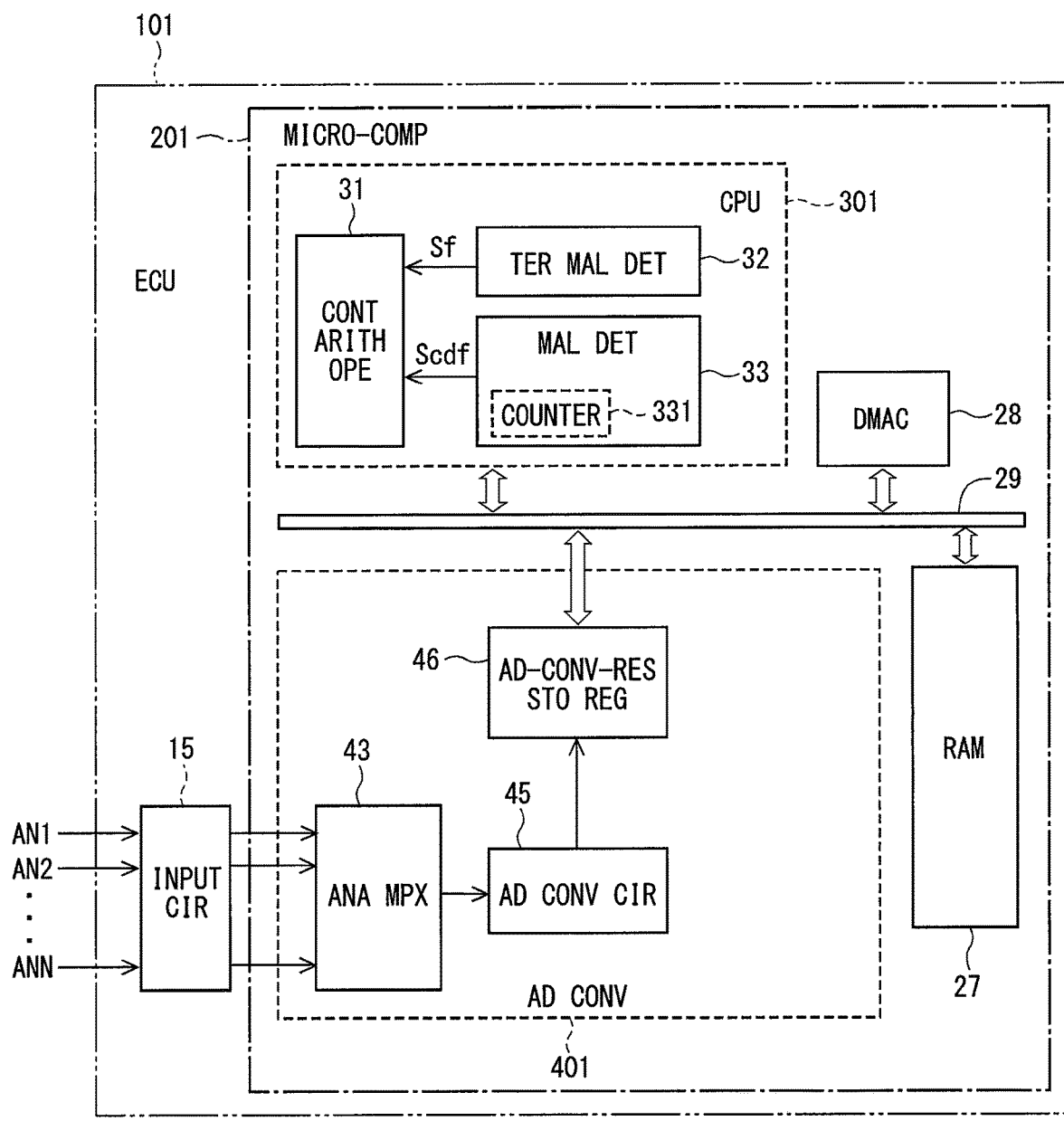
FIG. 2 is a block diagram of a signal control device according to a first embodiment.

With reference to FIG. 2, configurations of the ECU 101 and a microcomputer (MICRO-COMP) 201 of the first embodiment will be described. In the following description of the configuration of the ECU 101, the inverter 7 is omitted. The microcomputer 201 includes an AD converter (AD CONV) 401, a CPU 301, a RAM 27, and a direct memory access controller (DMAC) 28, and can communicate therebetween via a bus 29.

In the first embodiment, it is assumed that a plurality of input signals AN1, AN2, . . . , and ANN is input to the microcomputer 201. The AD converter 401 includes an analog multiplexer (ANA MPX) 43, an AD conversion circuit (AD CONV CIR) 45, and an AD-conversion-result storage register (AD-CONV-RES STO REG) 46. Among the plurality of input signals AN1, AN2, . . . , and ANN input from an external sensor to an input circuit (INPUT CIR) 15 of the ECU 101, a signal alternatively selected by the analog multiplexer 43 is AD converted by the AD conversion circuit 45. The AD conversion result by the AD conversion circuit 45 is stored in the AD-conversion-result storage register 46. A detailed configuration of the AD converter 401 will be described later with reference to FIG. 3.

The CPU 301 according to the first embodiment includes a control arithmetic operation section (CONT ARITH OPE) 31, a terminal malfunction determination section (TER MAL DET) 32, and a malfunction determination section (MAL DET) 33. The control arithmetic operation section 31 executes a predetermined control arithmetic operation using at least a part of AD conversion values of the AD conversion results of the AD conversion circuit 45 in the AD converter 401. In the present embodiments applied to the electric power steering system 90, the control arithmetic operation section 31 performs AD conversion of the input signals AN1, AN2, . . . , and ANN such as the steering torque Ts, the inverter current Iinv, the motor rotation angle θ, and the battery voltage Vb, and calculates the assist amount of the assist motor 8 based on the AD conversion values.

Figure 3:
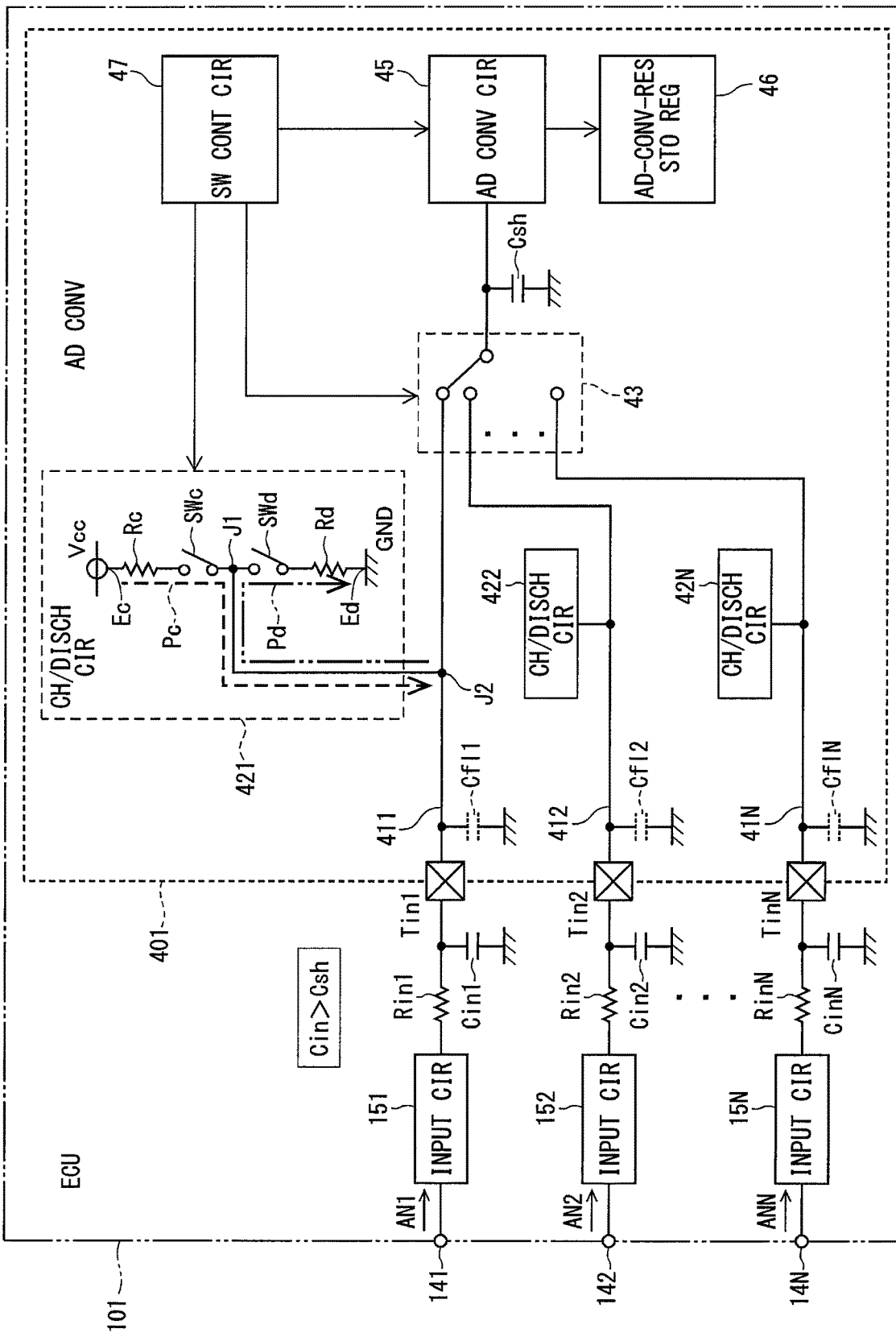
FIG. 3 is a block diagram of an AD converter in the signal control device according to the first embodiment.

The terminal malfunction determination section 32 has a configuration disclosed in US 2017/0155400 A1, which is incorporated herein by reference, and will be briefly described with reference to FIG. 3. The terminal malfunction determination section 32 detects a "terminal malfunction" that is an open circuit failure of the signal input terminal Tin1, Tin2, . . . , or TinN or a disconnection failure of an input signal path 411, 412, . . . , or 41N. Upon detecting the terminal malfunction, the terminal malfunction determination section 32 executes a charge/discharge AD conversion in a state connected to a charge/discharge circuit 421, 422, . . . , or 42N. Upon detecting the terminal malfunction, the terminal malfunction determination section 32 notifies the control arithmetic operation section 31 of a malfunction signal Sf.

In order to confirm that no malfunction occurs in the function of the charge/discharge circuit 421, 422, . . . , or 42N as a precondition that the terminal malfunction determination section 32 detects the terminal malfunction, the malfunction determination section 33 detects a malfunction of the charge/discharge circuits 421, 422, . . . , or 42N at a timing different from a timing at which the control arithmetic operation section 31 performs the control arithmetic operation. Upon detecting a malfunction of the charge/discharge circuits 421, 422, . . . , or 42N, the malfunction determination section 33 notifies the control arithmetic operation section 31 of a malfunction signal Scdf. The malfunction determination section 33 includes a number counter (COUNTER) 331 therein and counts the number of diagnoses or the number of provisional determinations described later. The detailed configuration and operation of the malfunction determination section 33 will be described later.

The RAM 27 stores arithmetic operation results by the CPU 301. The DMAC 28 operates independently from the CPU 301, and transfers the AD conversion value stored in the AD-conversion-result storage register 46 to the RAM 27.

Next, the configuration of the AD converter 401 of the first embodiment will be described with reference to FIG. 3. A plurality of input signals AN1, AN2, . . . , and ANN with voltage values fluctuating within a predetermined fluctuation range is input to the AD converter 401 of the first embodiment. Correspondingly, a plurality of sets of components corresponding to the respective input signals is provided. In FIG. 3, for a plurality of components, "1, 2, . . . , and N" are added to the end of the numeral or alphabet code. Common matters shall be described comprehensively by using the code excluding "1, 2, . . . , and N" at the end. Also, the head of each component is appropriately labeled with "Nth" word.

In the ECU 101, the signals from the external sensors are input to input circuits 151, 152, . . . , and 15N provided outside the AD converter 401 via external input terminals 141, 142, . . . , and 14N, respectively. Input resistors Rin1, Rin2, . . . , and RinN are respectively connected between the input circuits 151, 152, . . . , and 15N and signal input terminals Tin1, Tin2, . . . , and TinN of the AD converter 401.

Input-side capacitors Cin1, Cin2, . . . , and CinN are provided between the signal input terminals Tin1, Tin2, . . . , and TinN and a reference potential on the side of the AD converter 401 which is closer to the input circuits 151, 152, . . . , and 15N to suppress fluctuations of the input voltages. It is preferable that, to appropriately suppress fluctuations in input voltages, the capacitances of the input-side capacitors Cin1, Cin2, . . . , and CinN are normally larger than the capacitance of a sampling capacitor Csh of the AD converter 401. However, depending on the characteristics of the input signals, it is not limited thereto. A configuration may also be such that the input-side capacitors Cin1, Cin2, . . . , and CinN are not provided.

The AD converter 401 includes the signal input terminals Tin1, Tin2, . . . , and TinN, the sampling capacitor Csh, the input signal paths 411, 412, . . . , and 41N, the charge/ discharge circuits 421, 422, . . . , and 42N, the analog multiplexer 43, the AD conversion circuit 45, the AD-conversion-result storage register 46, and a switch control circuit (SW CONT CIR) 47. The input signals AN1, AN2, . . . , and ANN are input from the corresponding input circuits 151, 152, . . . , and 15N to the signal input terminals Tin1, Tin2, . . . , and TinN. The input signals AN1, AN2, . . . , and ANN are transmitted to the sampling capacitor Csh via the input signal paths 411, 412, . . . , and 41N and the analog multiplexer 43. Stray capacitances (or parasitic capacitances) Cfl1, Cfl2, . . . , and CflN are generated between the signal input terminals Tin1, Tin2, . . . , and TinN and the reference potential.

One end of the sampling capacitor Csh is connected to the signal input terminals Tin1, Tin2, . . . , and TinN via the analog multiplexer 43 and the input signal paths 411, 412, . . . , and 41N, and the other end of the sampling capacitor Csh is connected to the reference potential. The reference potential is typically the ground potential, but is not limited to the ground potential. The analog multiplexer 43 alternatively selects one of the plurality of signal input terminals Tin1, Tin2, . . . , and TinN and connects the selected signal input terminal to the sampling capacitor Csh. The AD conversion circuit 45 converts the analog voltage value charged in the sampling capacitor Csh into the AD conversion value that is a digital value.

The AD-conversion-result storage register 46 stores the AD conversion value obtained by the AD conversion circuit 45. The AD conversion value stored in the AD-conversion-result storage register 46 is transferred to the RAM 27 and the CPU 301 via the bus 29. The switch control circuit 47 operates charge switches SWc and discharge switches SWd of the charge/discharge circuits 421, 422, . . . , and 42N and a switch of the analog multiplexer 43.

The charge/discharge circuits 421, 422, . . . , and 42N are circuits that can positively charge or discharge the sampling capacitor Csh. FIG. 3 shows the detailed configuration of a first charge/discharge circuit (C/D CIR) 421, but the other charge/discharge circuits 422, . . . , and 42N have the same configuration.

The charge/discharge circuit 421 includes a charge path Pc, a discharge path Pd, the charge switch SWc, and the discharge switch SWd. The charge path Pc is provided from a charge power supply end Ec to a second connection point J2 on the input signal path 411 via a first connection point J1 as indicated by the broken line. The discharge path Pd is provided from the second connection point J2 to a reference potential end Ed via the first connection point J1 as indicated by the two-dot chain line. The charge power supply end Ec is applied with a charge power supply voltage Vcc (for example, 5 V). The reference potential terminal Ed is, for example, a GND potential, and in the present case, the reference potential terminal Ed may be referred to as a "ground terminal". A portion between the charge power supply end Ec and the first connection point J1 is a portion dedicated to the charge path Pc and the portion between the first connection point J1 and the reference potential end Ed is a portion dedicated to the discharge path Pd. A portion between the first connection point J1 and the second connection point J2 is shared by the charge path Pc and the discharge path Pd.

The charge switch SWc can switch electrical connection and electrical disconnection between the charge path Pc and the sampling capacitor Csh, and can charge the sampling capacitor Csh when the charge path Pc and the sampling capacitor Csh are electrically connected. Further, a resistor Rc is connected in series with the charge switch SWc. The discharge switch SWd can switch electrical connection and electrical disconnection between the discharge path Pd and the sampling capacitor Csh, and can discharge the sampling capacitor Csh when the discharge path Pd and the sampling capacitor Csh are electrically connected. Further, a resistor Rd is connected in series with the discharge switch SWd.

When the charge switch SWc is turned on and the discharge switch SWd is turned off, charges of the charge power supply voltage Vcc are charged in the sampling capacitor Csh. The above-described operation is referred to as a "charge operation". Further, when the discharge switch SWd is turned on and the charging switch SWc is turned off, charges in the sampling capacitor Csh are discharged to the ground potential GND, that is, the referential potential. The above-described operation is referred to as a "discharge operation".

When neither the charge switch SWc nor the discharge switch SWd is electrically connected, the charge/discharge circuit 421 and the sampling capacitor Csh are electrically disconnected. In this way, by turning on or off the charge/discharge switches SWc and SWd, the AD converter 401 can switch electrical connection and electrical disconnection between the charge/discharge circuit 421 and the sampling capacitor Csh, and can charge or discharge the sampling capacitor Csh when the charge/discharge circuit 421 and the sampling capacitor Csh are electrically connected.

Here, return to the description of the malfunction determination section 33 of the CPU 301. The malfunction determination section 33 performs an AD conversion with the AD conversion circuit 45 after performing a charge operation or a discharge operation to the sampling capacitor Csh with the charge/discharge circuit 421, 422, . . . , or 42N. Then, the malfunction determination section 33 determines the malfunction of the charge/discharge circuit 421, 422, . . . , or 42N based on the diagnosis result of the AD conversion value.

Next, the significance of the present embodiments having the above-described configuration will be described. The signal control device according to the related art can perform a control arithmetic operation using a correct AD conversion value obtained by the input AD conversion while constantly confirming that the AD converter is correctly operating. However, if a malfunction occurs in the charge/discharge circuit 421, 422, . . . , or 42N due to some cause, there is a possibility that the signal control device according to the related art cannot charge or discharge correctly and misses a terminal malfunction to be detected.

Therefore, in the present embodiments, at the timing different from the timing at which the control arithmetic operation section 31 performs the control arithmetic operation, the charge operation or the discharge operation to the sampling capacitor Csh is performed with the charge/discharge circuit 421, 422, . . . , or 42N, and then the AD conversion with the AD conversion circuit 45 is performed. Then, by evaluating whether the AD conversion value is a correct value, a malfunction of the charge/discharge circuit 421, 422, . . . , or 42N is determined. The timing at which the control arithmetic operation is performed refers to the timing at which the AD conversion is performed in a state where the input signal AN is sampled to the sampling capacitor Csh and the control according to the input signal AN is performed.

Figure 4:
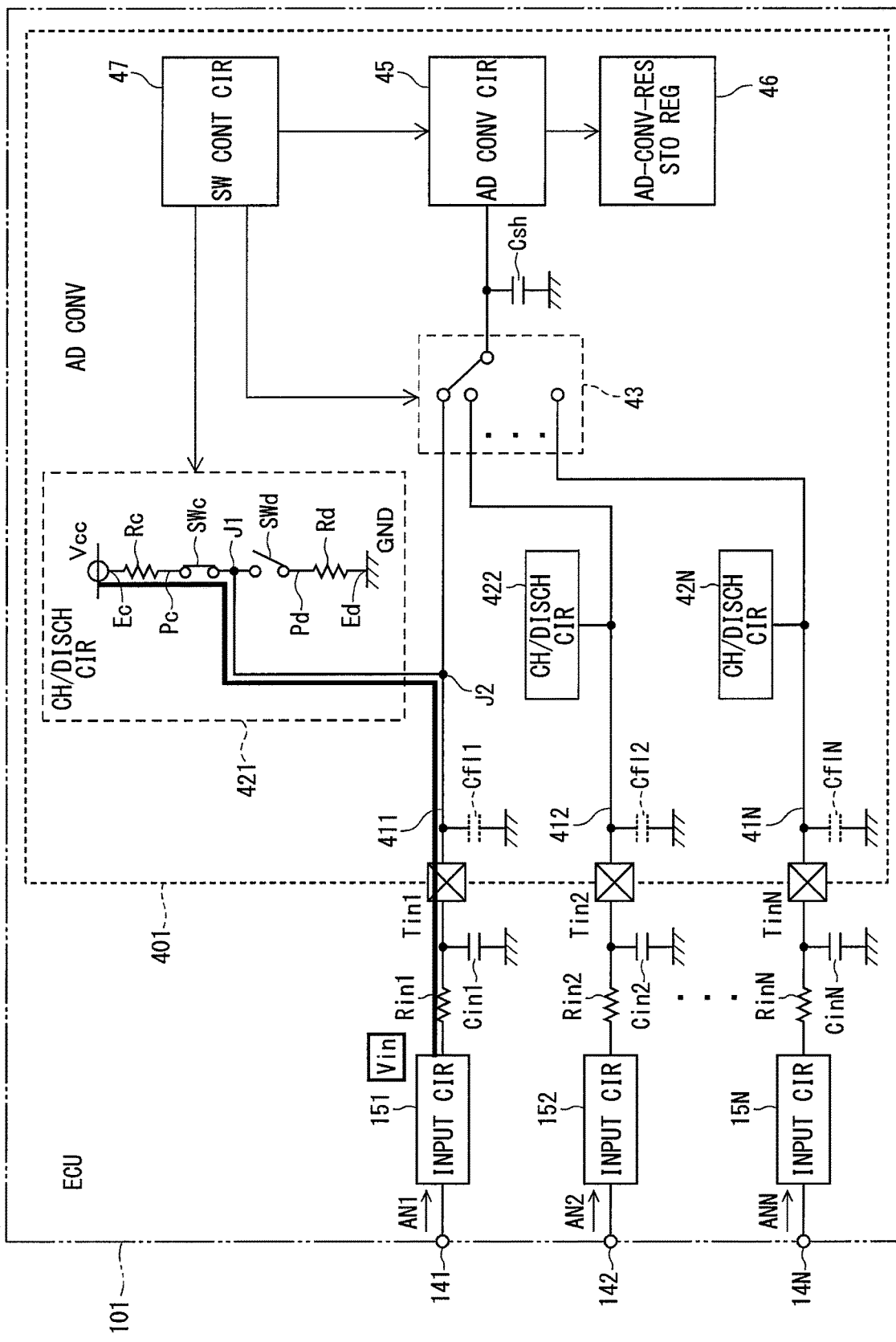
FIG. 4 is a diagram for explaining an AD conversion value in a case where a charge switch is normal.

For example, FIG. 4 shows a state in which the charge switch SWc is turned on and the discharge switch SWd is turned off, that is, the charge operation is performed. When the charge switch SWc is normal, a path is connected as shown by the bold solid line. Assuming that the voltage of the input circuit 151 is Vin, a potential theoretical value Vj2 of the second connection point J2 is a value represented by Equation (1), and the value is subjected to the AD conversion.

$$Vj2 = Vin + (Vcc - Vin) \times Rin/(Rin+Rc) \qquad (1)$$

If it is known that the input circuit voltage Vin always becomes the GND level (that is, about 0 V) before the start of the control, the potential theoretical value Vj2 in Equation (2) obtained by substituting "Vin=0" into Equation (1) becomes a voltage value that should be originally subjected to the AD conversion.

$$Vj2 = Vcc \times Rin/(Rin+Rc) \qquad (2)$$

Figure 5:
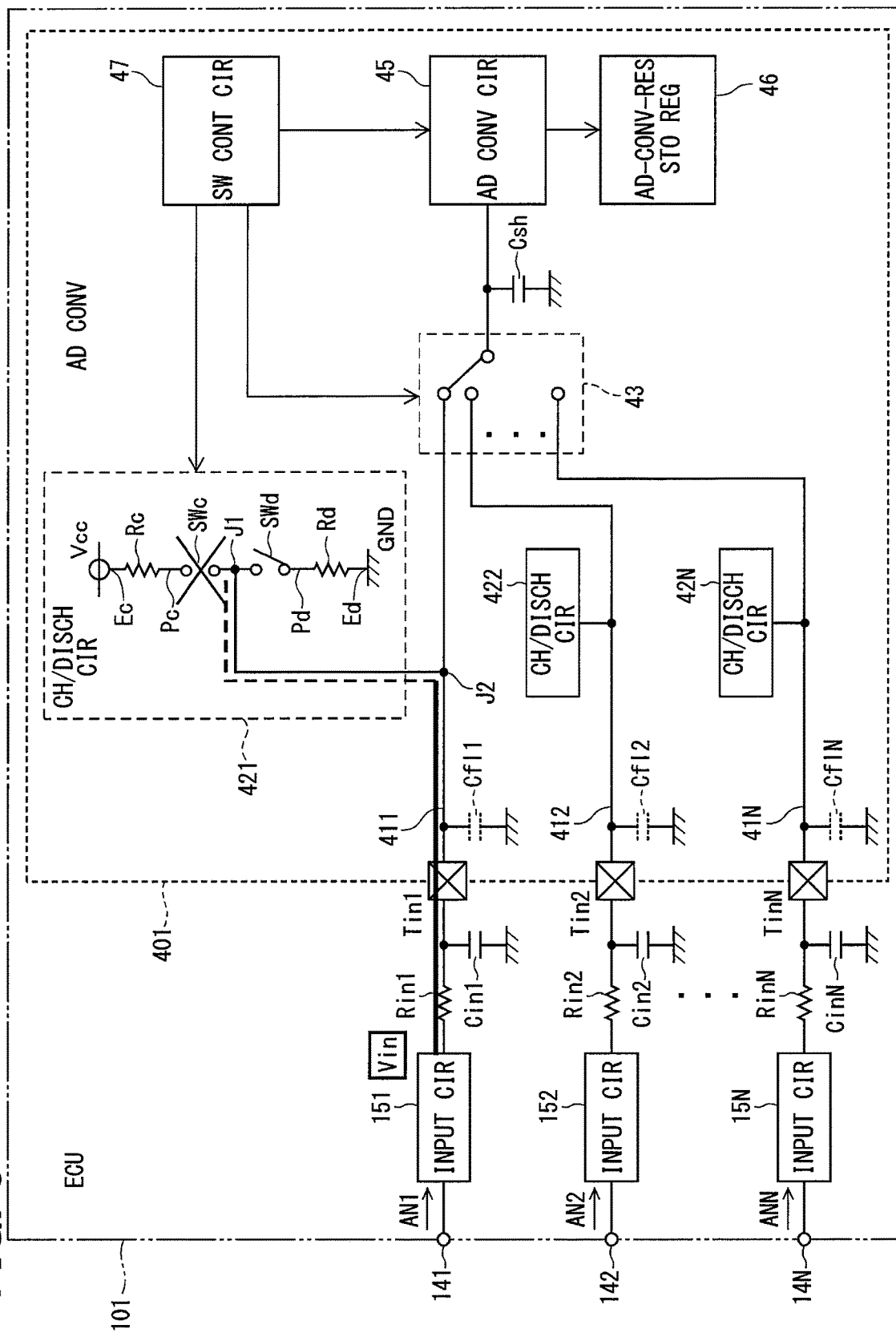
FIG. 5 is a diagram for explaining an AD conversion value in a case where a disconnection failure occurs in a charge switch.

FIG. 5 shows a state in which an open failure occurs in the charge switch SWc. At this time, a voltage derived from the charge power supply voltage Vcc is not applied to the second connection point J2, and a voltage obtained by subtracting a voltage drop due to the input resistor Rin from the input circuit voltage Vin is applied to the second connection point J2. If the input circuit voltage Vin is at the GND level, the AD conversion value has a value close to 0 V. Since the AD conversion value in a case where an open failure occurs in the charge switch SWc can be distinguished from the AD conversion value in a case where the charging switch SWc is normal, an open failure of the charge switch SWc can be detected.

FIG. 6 shows failure modes, failure examples, failure detection methods, and expected values of the AD conversion value of the charge/discharge circuit 421, 422, . . . , or 42N. In the failure detection methods, AD conversions are performed in a state where the switch is operated as shown in FIG. 6. The expected values are values assuming that "Vin≈0, Rin»Rc". In a configuration where an input interruption switch SWin1, SWin2, . . . , or SWinN is provided as in the second embodiment shown in FIG. 14, the state of "Vin=0, Rin=∞" is ideally realized by electrically disconnecting the input interruption switch SWin1, SWin2, . . . , or SWinN. In a case where the input interruption switch SWin1, SWin2, . . . , or SWinN is not provided or when a failure is detected in a state where the input interruption switch SWin1, SWin2, . . . , or SWinN is electrically connected, the expected value may be calculated while appropriately taking the input circuit voltage Vin and a division ratio of the input resistor Rin and the resistor Rc into account.

Next, each check will be described in turn. In the description here, the "charge switch SWc" and the "discharge switch SWd" are simply referred to as "SWc" and "SWd". Also, "the charge power supply voltage Vcc" is simply referred to as "Vcc".

No. 1: Failure Mode="Cannot Charge Correctly"

A failure example is an off-fixing of SWc. An AD conversion is performed in a state where SWc is on and SWd is off. If the charge/discharge circuit 421, 422, . . . , or 42N is normal, the AD conversion value becomes a value near Vcc.

No. 2: Failure Mode="Always Charge"

A failure example is an on-fixing of SWc. An AD conversion is performed in a state where SWc is off and SWd is on. If the charge/discharge circuit 421, 422, . . . , or 42N is normal, the AD conversion value becomes a value near GND.

No. 3: Failure Mode="Cannot Discharge Correctly"

A failure example is an off-fixing of SWd. An AD conversion is performed in a state where SWc is off and SWd is on. If the charge/discharge circuit 421, 422, . . . , or 42N is normal, the AD conversion value becomes a value near GND.

No. 4: Failure Mode="Always Discharge"

A failure example is an on-fixing of SWd. An AD conversion is performed in a state where SWc is on and SWd is off. If the charge/discharge circuit 421, 422, . . . , or 42N is normal, the AD conversion value becomes a value near Vcc.

No. 5: Failure Mode="Malfunction of Charge/Discharge Characteristics"

A failure example is that the resistance values of the resistors Rc and Rd change. An AD conversion is performed in a state where SWc is on and SWd is on. If the charge/discharge circuit 421, 422, . . . , or 42N is normal, the AD conversion value is a value near the divided voltage value Vc–d shown in Equation (3).

$$Vc-d = Vcc \times Rd/(Rc+Rd) \qquad (3)$$

No. 6: Failure Mode="Combination of Above"

A failure example is an on-fixing of both Swc and SWd. The failure detection methods and expected values depend on the above combination.

Regarding the failure examples in FIG. 6, for example, the "off-fixing of SWc" includes "disconnection of the wiring of the resistance Rc and the charge path Pc". If the failure mode is the same, the failure can be detected by the detection method in FIG. 6. For the six kinds of checks shown in FIG. 6, all of them may be performed, or one of them may be selected and performed.

It is unknown what kind of electric charge is held in the stray capacitance Cfl or the sampling capacitor Csh when the microcomputer 201 is started up. In many cases, the AD conversion value is near GND. However, in such a case, when performing the check No. 2, a value near GND may be obtained despite the AD converter 401 cannot discharge originally. Therefore, in order to correctly detect the failure of the discharge circuit, it is desirable to check the discharge operation after performing the charge operation in advance. To the contrary, in order to correctly detect the failure of the charge circuit, it is desirable to check the charge operation after performing the discharge operation in advance.

For example, when the check No. 1 is performed, if the charge circuit is normal, the sampling capacitor Csh is inevitably charged with electric charges. Therefore, checks may be performed in order from No. 1 to No. 2 so as to realize a charge before the discharge circuit check. Similarly, checks may be performed in order from No. 3 to No. 4 so as to realize a discharge before the charge circuit check. Furthermore, in order to distinguish between a temporal malfunction and a permanent malfunction, a number counter may be provided for each of a charge diagnosis and a discharge diagnosis, and when the number of diagnoses determined as normal or a malfunction reaches a threshold value, it may be determined as normal or the malfunction.

The following describes examples of a malfunction determination process performed by the malfunction determination section 33 with reference to flowcharts in FIGS. 7 to 12.

Figure 7:
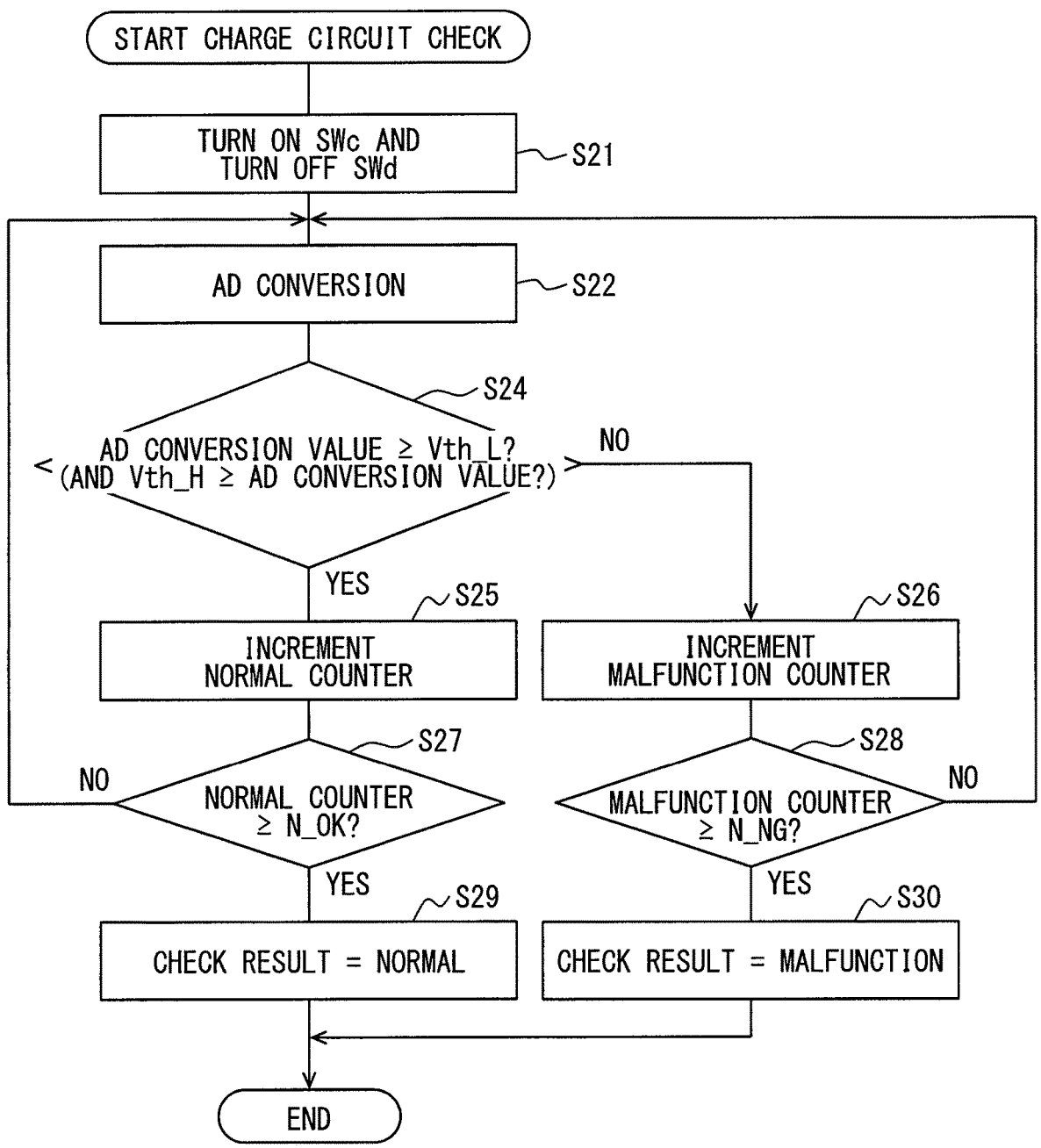
FIG. 7 is a flowchart of a charge circuit check.
Figure 8:
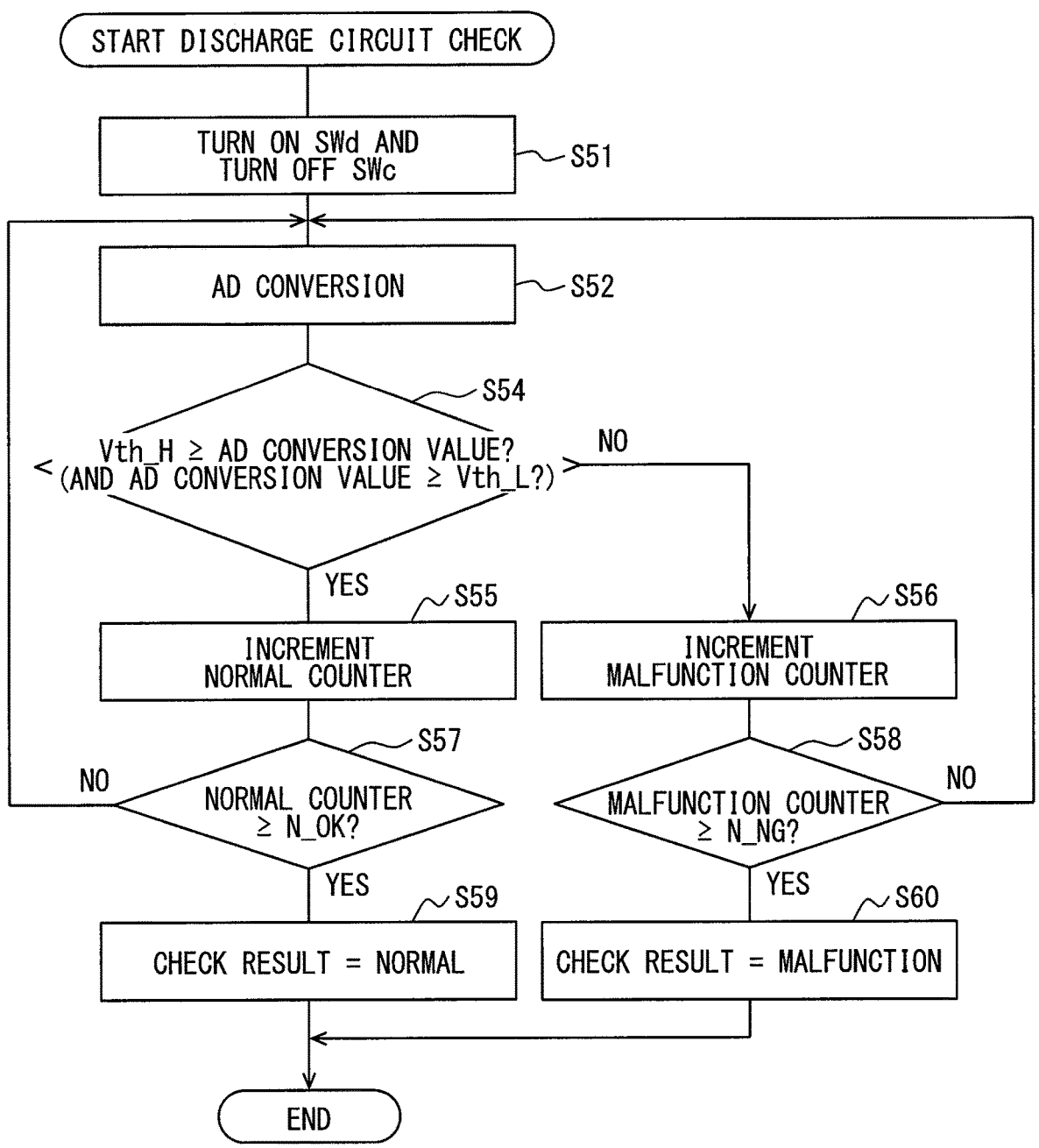
FIG. 8 is a flowchart of a discharge circuit check.

FIG. 7 shows a flowchart of a charge circuit check and FIG. 8 shows a flowchart of a discharge circuit check individually. For example, depending on the type of the input signal AN, it may be sufficient to perform only one of the charge circuit check and the discharge circuit check. The charge circuit check corresponds to the check No. 1 and No. 4 in FIG. 6, and the discharge circuit check corresponds to the check No. 2 and No. 3 in FIG. 6. The whole processes in FIGS. 7 and 8 are respectively handled as predefined processes S20 and S50 in the flowcharts in FIGS. 10 to 12.

In the malfunction determination process, the switch control circuit 47 operates on/off of the charge switch SWc and the discharge switch SWd based on a command from the malfunction determination section 33. In addition, the AD conversion circuit 45 performs an AD conversion based on a command from the malfunction determination section 33. In the following description, a description of an involvement of the switch control circuit 47 and the AD conversion circuit 45 is omitted, and a description will be given on the assumption that the malfunction determination section 33 performs the switch operation and the AD conversion.

In the charge circuit check shown in FIG. 7, the malfunction determination section 33 performs a charge operation by turning on the charge switch SWc and turning off the discharge switch SWd at S21, and then performs an AD conversion at S22. In the process in FIG. 7, a state of the charge operation in which the charge switch SWc is turned on is continued until the charge circuit check ends while the charge switch SWc is turned off after the AD conversion in a process in FIG. 9 to be described later.

Subsequently, the malfunction determination section 33 compares the AD conversion value with a lower limit threshold value Vth_L to perform a charge diagnosis at S24 to S26. When the AD conversion value is equal to or greater than the lower limit threshold value Vth_L (YES at S24), a normal counter is incremented at S25. When the AD conversion value is less than the lower limit threshold value Vth_L (NO at S24), a malfunction counter is incremented at S26. At S24, the malfunction determination section 33 may diagnose as normal if the AD conversion value is not less than the lower limit threshold value Vth_L and not more than an upper limit threshold value Vth_H. The malfunction determination section 33 diagnoses as a malfunction at least when the AD conversion value is less than the lower limit threshold value Vth_L.

The charge diagnosis is performed once or more in one charge circuit check, and when the number of diagnoses determined as normal or the number of diagnoses determined as the malfunction reaches a predetermined number, the result of the charge circuit check is determined as normal or a malfunction. At S27, the malfunction determination section 33 determines whether the normal counter reaches a normal diagnosis threshold value N_OK. If NO at S27, the process returns to S22 and the AD conversion is performed again. At S28, the malfunction determination section 33 determines whether the malfunction counter reaches a malfunction diagnosis threshold value N_NG. If NO at S28, the process returns to S22 and the AD conversion is performed again. At the time, the state of the charge operation is continued, and the process of "performing the AD conversion again in the state of the charge operation" is executed.

If YES at S27, the malfunction determination section 33 determines at S29 that the result of the charge circuit check is normal. If YES at S28, the malfunction determination section 33 determines at S30 that the result of the charge circuit check is the malfunction. The diagnosis threshold values N_OK, N_NG are set to integers of 1 or more. A case where the diagnosis threshold values N_OK, N_NG are set to 1 is substantially equivalent to a case where the counters are not provided. Therefore, the flowchart in FIG. 7 includes a configuration in which a counter is not provided for one or both of the normal determination and the malfunction determination. The processes at S25 and S27 may be ignored when a counter for the normal determination is not provided, and the processes at S26 and S28 may be ignored when a counter for the malfunction determination is not provided.

The flow of the discharge circuit check in FIG. 8 is basically the same as the flow of the charge circuit check in FIG. 7. In the discharge circuit check, the malfunction determination section 33 performs a discharge operation by turning on the discharge switch SWd and turning off the charge switch SWc at S51, and then performs an AD conversion at S52. In the process in FIG. 8, a state of the discharge operation in which the discharge switch SWd is turned on is continued until the discharge circuit check ends while the discharge switch SWd is turned off after the AD conversion in the process in FIG. 9 to be described later.

Subsequently, the malfunction determination section 33 compares the AD conversion value with the upper limit threshold value Vth_H to perform a discharge diagnosis at S54 to S56. When the AD conversion value is equal to or less than the upper limit threshold value Vth_H (YES at S54), a normal counter is incremented at S55. When the AD conversion value is greater than the upper limit threshold value Vth_L (NO at S54), a malfunction counter is incremented at S56. At S54, the malfunction determination section 33 may diagnose as normal if the AD conversion value is not greater than the upper limit threshold value Vth_H and not less than the lower limit threshold value Vth_L. The malfunction determination section 33 diagnoses as the malfunction at least when the AD conversion value is greater than the upper limit threshold value Vth_H.

The discharge diagnosis is performed once or more in one discharge circuit check, and when the number of diagnoses determined as normal or the number of diagnoses determined as the malfunction reaches a predetermined number, the result of the discharge circuit check is determined as normal or the malfunction. At S57, the malfunction determination section 33 determines whether the normal counter reaches a normal diagnosis threshold value N_OK. If NO at S57, the process returns to S52 and the AD conversion is performed again. At S58, the malfunction determination section 33 determines whether the malfunction counter reaches a malfunction diagnosis threshold value N_NG. If NO at S58, the process returns to S52 and the AD conversion is performed again. At the time, the state of the discharge operation is continued, and the process of "performing the AD conversion again in the state of the discharge operation" is executed. The diagnosis threshold values in the discharge circuit check may be different from the diagnosis threshold values in the charge circuit check.

If YES at S57, the malfunction determination section 33 determines at S59 that the result of the charge circuit check is normal. If YES at S58, the malfunction determination section 33 determines at S60 that the result of the charge circuit check is the malfunction. Similarly to FIG. 7, the flowchart in FIG. 8 includes a configuration in which a counter is not provided for one or both of the normal determination and the malfunction determination. The processes at S55 and S57 may be ignored when a counter for the normal determination is not provided, and the processes at S56 and S58 may be ignored when a counter for the malfunction determination is not provided.

Here, a charge/discharge circuit simultaneous check corresponding to the check No. 5 in FIG. 6 is supplemented. The charge/discharge circuit simultaneous check is a check for simultaneously diagnosing the malfunction of the charge switch SWc or the charge path Pc and the malfunction of the discharge switch SWd or the discharge path Pd. The malfunction determination section 33 performs "charge/discharge simultaneous diagnosis" one or more times in the charge/discharge circuit simultaneous check. In the charge/discharge simultaneous diagnosis, an AD conversion is performed in a state where both the charge switch SWc and the discharge switch SWd are turned on. When the AD conversion value is within a specified range, the charge/discharge circuit 421, 422, . . . , or 42N is diagnosed as normal, and when the AD conversion value is out of the specified range, the charge/discharge circuit 421, 422, . . . , or 42N is diagnosed as the malfunction. The specified range is set to a range including an error range with respect to the divided voltage value Vc–d of Equation (3).

Figure 9:
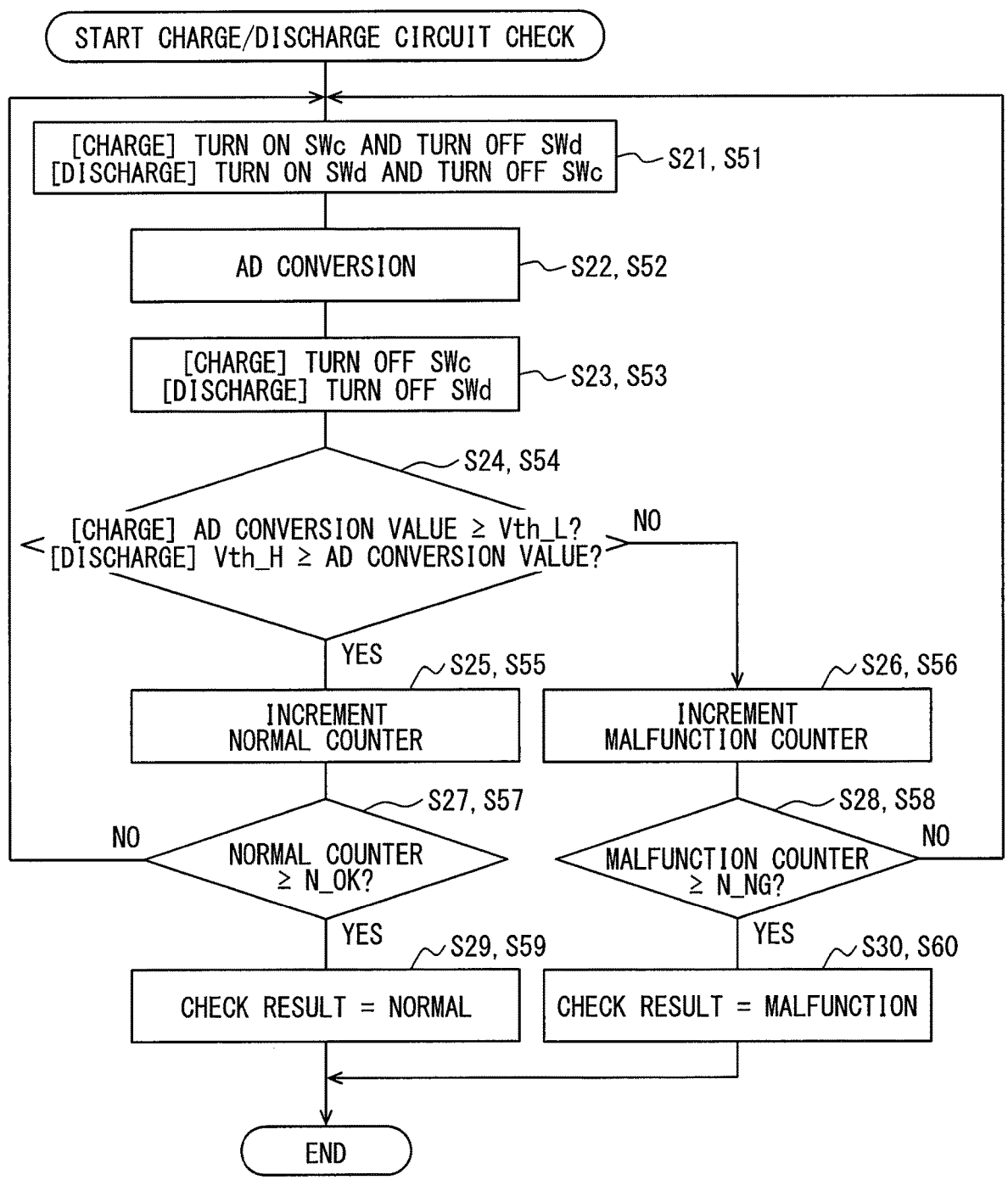
FIG. 9 is a flowchart in a case where a charge/discharge switch operation and an AD conversion are linked together.

Next, FIG. 9 shows a flowchart when the operations of the charge switch SWc and the discharge switch SWd are linked with the AD conversion. In FIG. 9, the charge circuit check and the discharge circuit check are indicated by a common flow, and contents of each check are described together for steps having different contents. As a point different from the flowcharts in FIGS. 7 and 8, S23 of turning off the charge switch SWc or S53 of turning off the discharge switch SWd are added after the AD conversion at S22 or S52. In addition, if NO is determined at S27 or S57, and if NO is determined at S28 or S58, the process returns to the state before S21 or S51, and the charge operation or the discharge operation is performed again. The processes of the charge circuit check and the discharge circuit check according to FIG. 9 are also handled as examples of the predefined process S20 and S50, respectively, in the flowcharts in FIGS. 10 to 12.

Some microcomputers can turn on the charge switch SWc or the discharge switch SWd only at the timing of the AD conversion. In such a case, since the charge operation or the discharge operation is performed only for a short time corresponding to one AD conversion, there is a possibility that the time is not enough for charging or discharging the sampling capacitor Csh. Thus, unless a failure has actually occurred, even if the malfunction determination section 33 diagnoses as the malfunction at first, by re-diagnosing the AD conversion value in a state where charge operation or discharge operation is repeated, the malfunction determination section 33 will diagnose as normal from when charging or discharging has reached a sufficient level. Therefore, by setting the malfunction diagnosis threshold value N_NG to be greater than the number of times of charge operation or discharge operation assumed to reach the sufficient level of charging or discharging, an erroneous diagnosis of diagnosing as the malfunction although the charge/discharge circuit 421, 422, . . . , or 42N is actually normal can be restricted.

Figure 10:
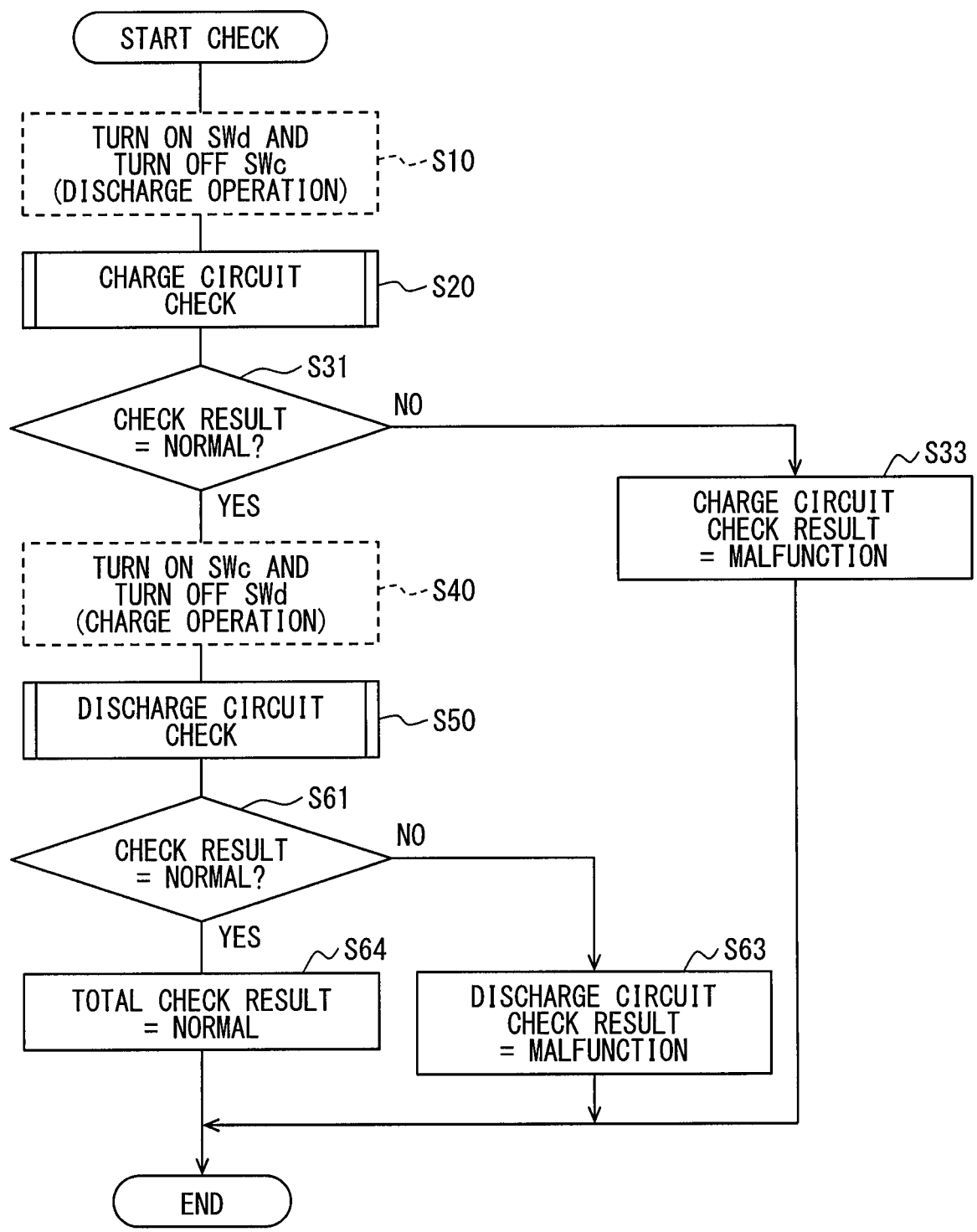
FIG. 10 is a flowchart of a malfunction determination process in which the charge circuit check and the discharge circuit check are combined.

Next, referring to FIG. 10, a malfunction determination process combining the charge circuit check and the discharge circuit check will be described. In the flowchart, the charge circuit check at S20 is shown in FIG. 7 or FIG. 9, and the discharge circuit check at S50 is shown at FIG. 8 or FIG. 9. FIG. 10 shows a process in which the discharge circuit check is performed subsequently to the charge circuit check. However, the order may be turned, and the charge circuit check may be performed subsequently to the discharge circuit check.

At S10 in FIG. 10, prior to the charge circuit check at S20, a discharge operation is performed to wait for discharge of the sampling capacitor Csh in a state where the discharge switch SWd is turned on and the charge switch SWc is turned off. At S31 after S20, the malfunction determination section 33 determines whether the result of the charge circuit check is normal. If YES at S31, the process proceeds to S40, and if NO at S31, the result of the charge circuit check is determined as malfunction again at S33.

At S40, prior to the discharge circuit check at S50, a charge operation is performed to wait for charging of the sampling capacitor Csh in a state where the charge switch SWc is turned on and the discharge switch SWd is turned off. At S61 after S50, the malfunction determination section 33 determines whether the result of the discharge circuit check is normal. If NO at S61, the result of the discharge circuit check is determined as the malfunction again at S63. If YES at S61, the result of the total check is determined as normal at S64.

One or both of S10 and S40 indicated by broken lines in FIG. 10 may be omitted in some cases. For example, as an initial characteristic of the microcomputer 201, there are cases where it is known that the sampling capacitor Csh is charged from a sufficiently low potential at the time of the charge circuit check. In such a case, the discharge operation before the charge circuit check (that is, S10) may be omitted. In a case where the discharge circuit check is performed subsequently to the charge circuit check, charging of the sampling capacitor Csh is completed during the charge circuit check. Thus, after completion of the charge circuit check, the discharge circuit check can be appropriately performed without performing the charge operation (that is, S40) again.

Next, with reference to FIG. 11 and FIG. 12, description will be given of a process of repeating the check when it is temporarily determined as the malfunction by the charge circuit check or the discharge circuit check, and then making a final determination. In the following description, "determination" is used for a final malfunction determination, and "provisional determination" is used for a malfunction determination in previous checks. Note that the term "provisional determination" is not used for a normal determination because the normal determination is not redone.

A process of repeating the charge diagnosis or the discharge diagnosis in one charge circuit check or the discharge circuit check and a process of repeating the charge circuit check or the discharge circuit check including one or more charge diagnoses or discharge diagnoses have different objects although the processes are operationally similar to each other. For example, as described with reference to FIG. 9, when the operation of the charge/discharge switches SWc and SWd and the AD conversion are linked, since the time of one charge or discharge operation is insufficient, the diagnosis is repeated until charge or discharge reaches the sufficient level to restrict an erroneous determination. On the other hand, in a case of repeating the charge/discharge circuit check, it is an object to eliminate the influence of an erroneous check based on an erroneous AD conversion value and to check correctly again by resetting the operation of the AD conversion circuit 45

Figure 11:
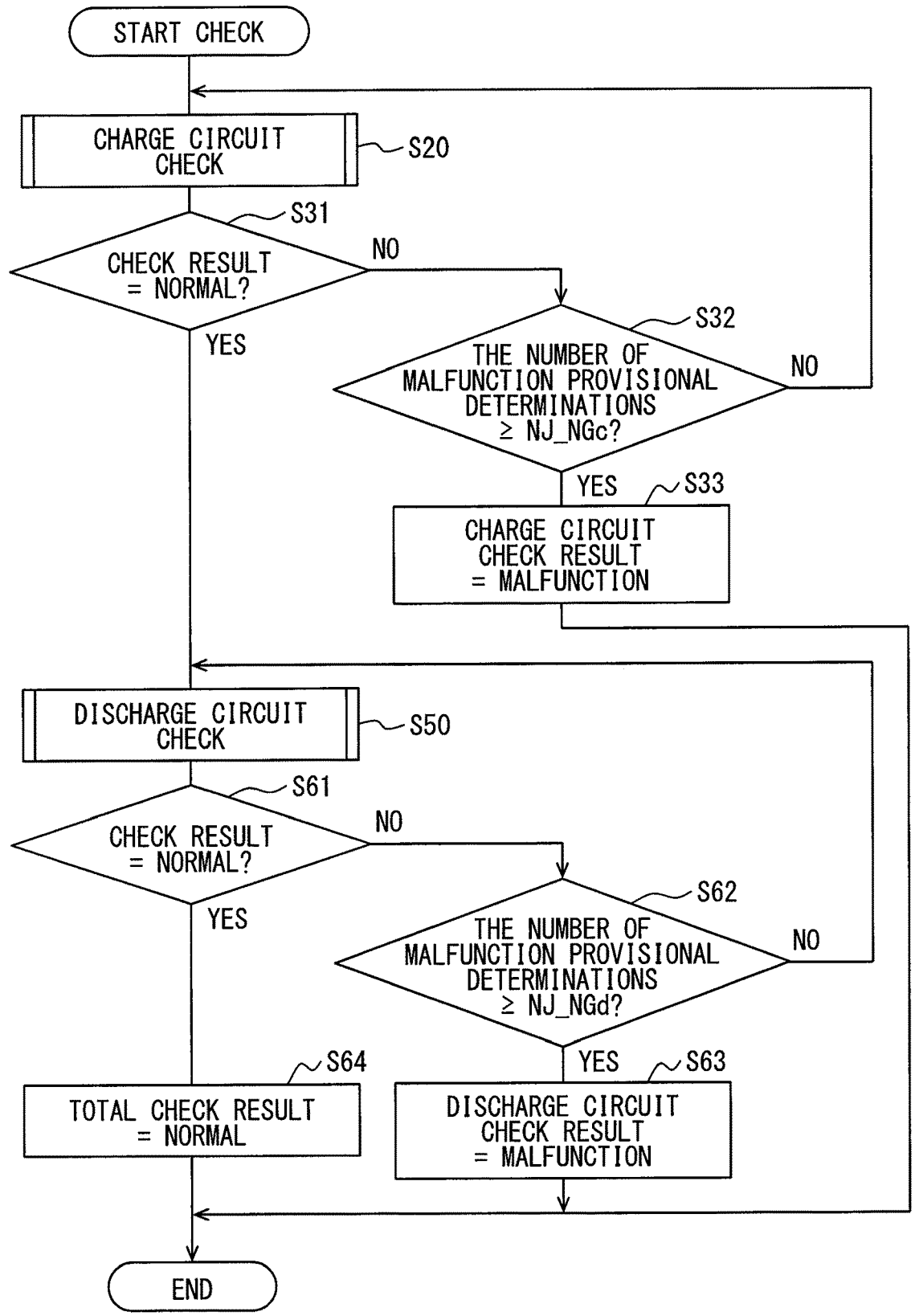
FIG. 11 is a flowchart of a malfunction determination process in which individual checks are repeated when provisionally determined as malfunction by the charge circuit check or the discharge circuit check.

In the process shown in FIG. 11, the charge circuit check or the discharge circuit check provisionally determined as the malfunction is individually repeated. After the charge circuit check at S20, the malfunction determination section 33 determines at S31 whether the charge/discharge circuit 421, 422, . . . , or 42N is determined as normal by the charge circuit check. If YES at S31, the process proceeds to the discharge circuit check at S50. If NO at S31, that is, when the charge/discharge circuit 421, 422, . . . , or 42N is provisionally determined as the malfunction by the charge circuit check, the malfunction determination section 33 determines at S32 whether the number of provisional determinations as the malfunction (that is, the number of malfunction provisional determinations) reaches a malfunction determination number threshold value NJ_NGc. The following malfunction determination number threshold values are set to integers of 1 or more. If NO at S32, the process returns to S20 to perform the charge circuit check again. If YES at S32, the malfunction determination section 33 determines at S33 that the result of the charge circuit check is the malfunction.

After the discharge circuit check at S50, the malfunction determination section 33 determines at S61 whether the charge/discharge circuit 421, 422, . . . , or 42N is determined as normal by the discharge circuit check. If NO at S61, that is, when the charge/discharge circuit 421, 422, . . . , or 42N is provisionally determined as malfunction by the discharge circuit check, the malfunction determination section 33 determines at S62 whether the number of provisional determinations as the malfunction (that is, the number of malfunction provisional determinations) reaches a malfunction determination number threshold value NJ_NGd. The malfunction determination number threshold value NJ_NGd of the discharge circuit check may be different from the malfunction determination number threshold value NJ_NGc of the charge circuit check. If NO at S62, the process returns to S50 to perform the discharge circuit check again. If YES at S62, the malfunction determination section 33 determines at S63 that the result of the discharge circuit check is the malfunction. If YES at S61, the result of the total check is determined as normal at S64.

Figure 12:
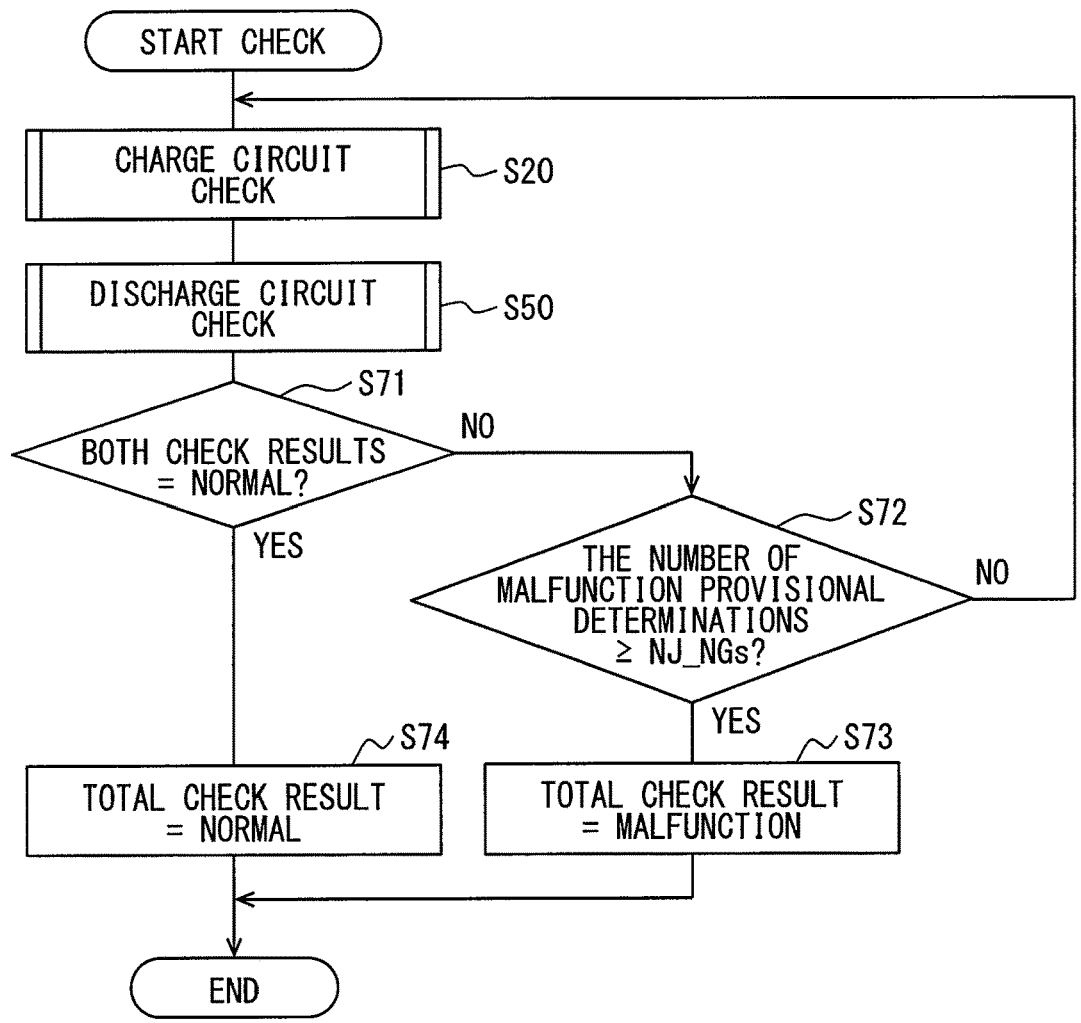
FIG. 12 is a flowchart of a malfunction determination process in which a series of checks is repeated when provisionally determined as a malfunction by the charge circuit check or the discharge circuit check.

In the process shown in FIG. 12, when the charge/discharge circuit 421, 422, . . . , or 42N is provisionally determined as the malfunction by at least one of the charge circuit check and the discharge circuit check, a series of checks is repeated. After the discharge circuit check at S50 is performed subsequently to the charge circuit check at S20, the malfunction determination section 33 determines at S71 whether the charge/discharge circuit 421, 422, . . . , or 42N is determined as normal both in the charge circuit check and the discharge circuit check. If NO at S71, the malfunction determination section S33 determines at S72 whether the number of malfunction provisional determinations in at least one of the checks reaches a malfunction determination number threshold value NJ_NGs. The malfunction determination number threshold value NJ_NGs may be different from the malfunction determination number threshold values NJ_NGc and NJ_NGd in FIG. 11. If NO at S72, the process returns to S20 to perform the charge circuit check and the discharge circuit check again. If YES at S72, the result of the total check is determined as the malfunction at S73. If YES at S71, the result of the total check is determined as normal at S74.

The above-described malfunction determination processes may be performed for each of the charge/discharge circuits 421, 422, . . . , and 42N corresponding to the signal input terminals Tin1, Tin2, . . . , and TinN. Alternatively, after the charge operation or the discharge operation is performed simultaneously for all of the charge/discharge circuits 421, 422, . . . , and 42N, the charge circuit check or the discharge circuit check may be performed simultaneously for all of the charge/discharge circuits 421, 422, . . . , and 42N. Alternatively, the charge operation and the charge circuit check may be performed for the charge/discharge circuit corresponding to a specified signal input terminal, and the discharge operation and the discharge circuit check may be performed for the charge/discharge circuit corresponding to another signal input terminal.

Figure 13:
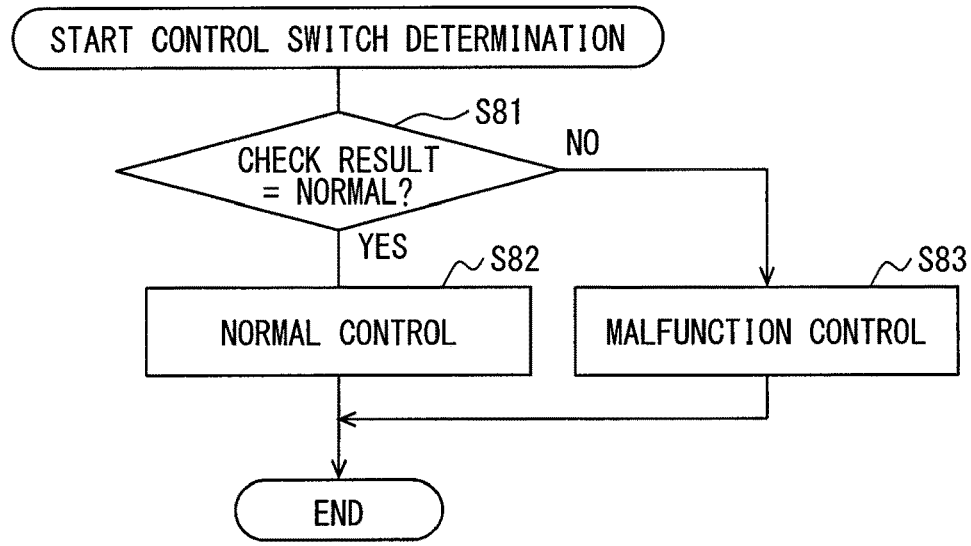
FIG. 13 is a flowchart of a control arithmetic operation process when a malfunction of the charge/discharge circuit is determined.

Next, with reference to FIG. 13, a description will be given of a process performed by the control arithmetic operation section 31 when one or more of the plurality of charge/discharge circuits 421, 422, . . . , and 42N is determined as the malfunction. At S81, the malfunction determination section 33 determines whether the result of the charge/discharge circuit check is normal. If the check result is normal (YES at S81), a normal control is performed at S82. If the check result is malfunction (NO at S81), a malfunction control is performed at S83.

In the malfunction control, the control arithmetic operation section 31 stops usage of the AD conversion value corresponding to the charge/discharge circuit 421, 422, . . . , or 42N determined as the malfunction, and uses only the AD conversion value corresponding to the charge/discharge circuits 421, 422, . . . , or 42N determined as normal to execute the control arithmetic operation. Further, during the execution of the control arithmetic operation, the terminal malfunction determination section 32 can appropriately perform the detection of the terminal malfunction for the signal input terminals Tin1, Tin2, . . . , or TinN corresponding to the charge/discharge circuit 421, 422, . . . , or 42N determined as normal.

Second Embodiment

Figure 14:
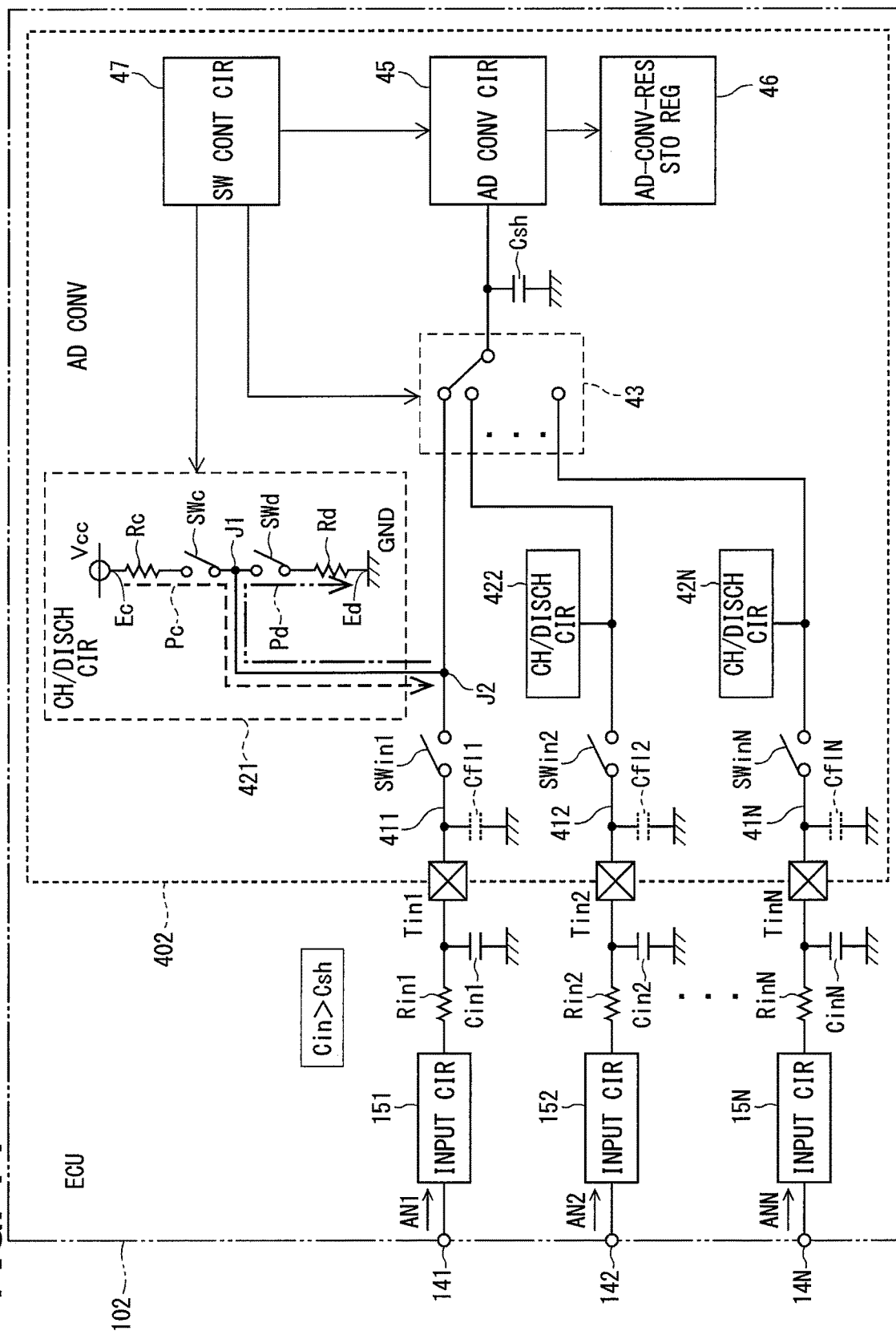
FIG. 14 is a block diagram of an AD converter in the signal control device according to a second embodiment.

A second embodiment will be described with reference to FIGS. 14 and 15. As shown in FIG. 14, an ECU 102 of the second embodiment is configured such that input interruption switches SWin1, SWin2, . . . , and SWinN are provided on the input signal paths 411, 412, . . . , and 41N between the signal input terminals Tin1, Tin2, . . . , and TinN and the second connection point J2 in an AD converter 402. The input interruption switches SWin1, SWin2, . . . , and SWinN can electrically disconnect the input signal paths 411, 412, . . . , and 41N between the signal input terminal Tin1, Tin2, . . . , and TinN and the second connection point J2.

Figure 15:
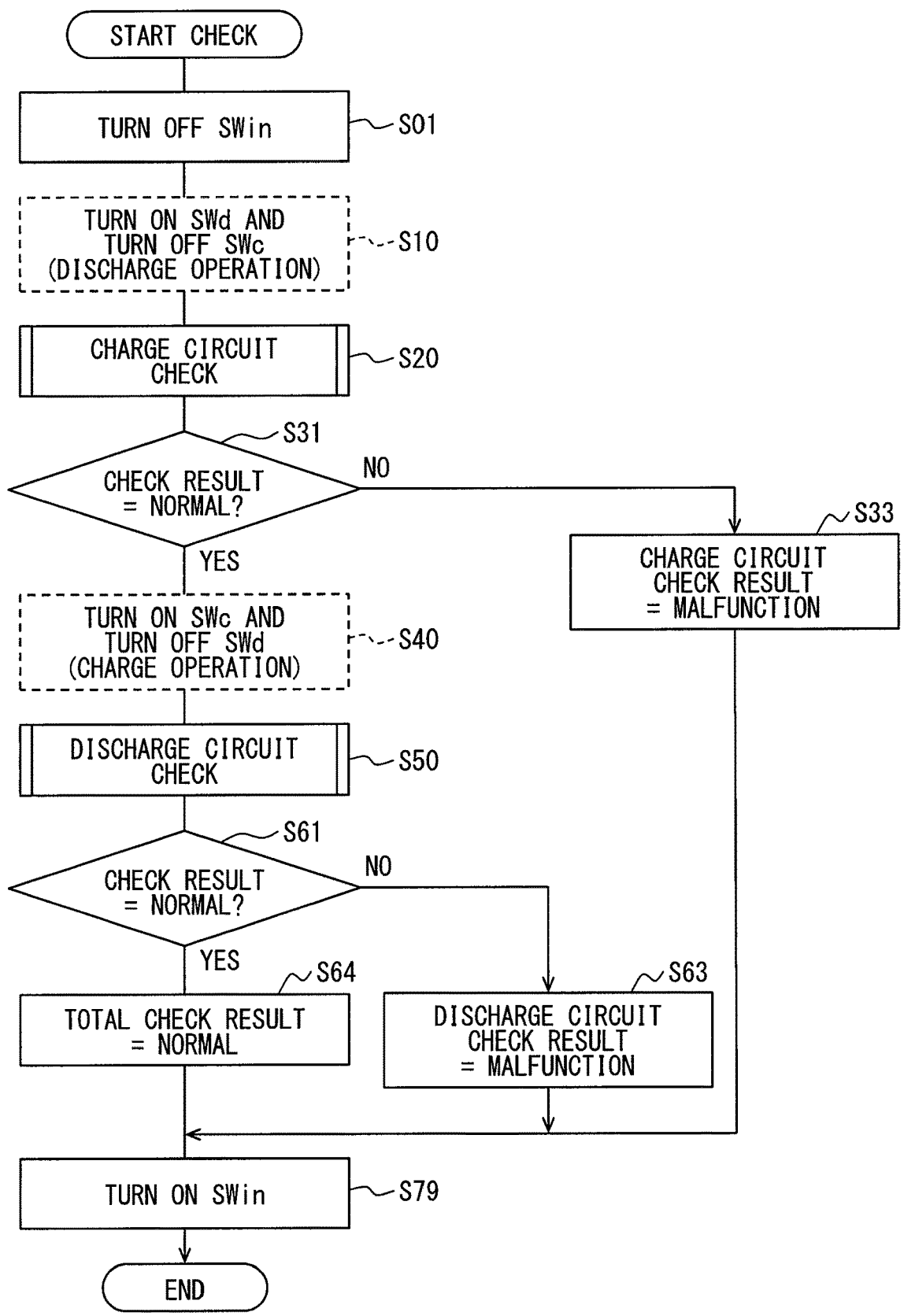
FIG. 15 is a flowchart of a malfunction determination process according to the second embodiment in which a charge circuit check and a discharge circuit check are combined.

FIG. 15 is a flowchart of a malfunction determination process according to the second embodiment in which the charge circuit check and the discharge circuit check are combined. In the process of FIG. 15, S01 to turn off the input interruption switch SWin1, SWin2, . . . , or SWinN is added at the beginning of the process in FIG. 10, and S79 to turn on the input interruption switch SWin1, SWin2, . . . , or SWinN is added to the end of the process. In FIG. 15, the input interruption switch SWin1, SWin2, . . . , or SWinN is simply referred to as "SWin".

The malfunction determination section 33 turns off the input interruption switch SWin1, SWin2, . . . , or SWinN at a timing different from the timing at which the AD conversion is performed (for example, before the start of control), and can check the charge/discharge circuit 421, 422, . . . , or 42N without being influenced by the voltage Vin of the input circuit 15. Further, by turning on the input interruption switch SWin1, SWin2, . . . , or SWinN after completion of the check, the ECU 102 can acquire the input signal from the input circuit 15 (for example, the current detection circuit of the electric power steering system 90) after the start of the control, and can perform the control arithmetic operation of the normal control.

Third Embodiment

Figure 16:
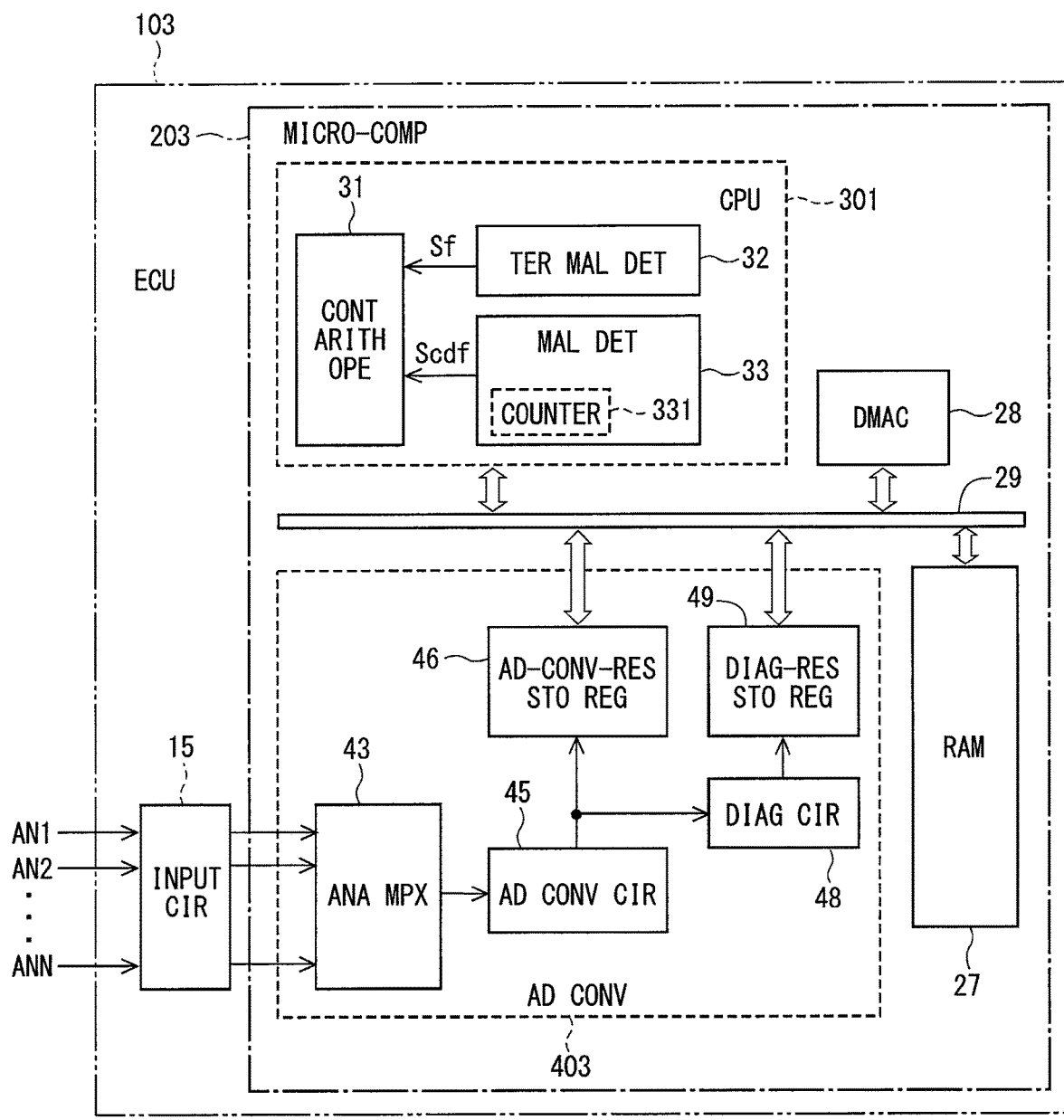
FIG. 16 is a block diagram of a signal control device according to a third embodiment.

A third embodiment will be described with reference to FIG. 16. An ECU 103 according to the third embodiment includes a diagnosis circuit (DIAG CIR) 48 and a diagnosis-result storage register (DIAG-RES STO REG) 49 in an AD converter 403 of a microcomputer 203. The AD conversion value AD-converted by the AD conversion circuit 45 is acquired from the AD-conversion-result storage register 46 to the control arithmetic operation section 31 of the CPU 301 via the bus 29, and is also acquired by the diagnosis circuit 48 inside the AD converter 403. The diagnosis circuit 48 compares the AD conversion value with upper and lower limit threshold values in a charge/discharge diagnosis, and stores the result in the diagnosis result storage register 49. That is, the diagnosis circuit 48 has only a function of determining the magnitude relations between the AD conversion value and the threshold values.

The diagnostic result stored in the diagnosis result storage register 49 is notified to the malfunction determination section 33 via the bus 29 and the number of times of normal diagnoses or malfunction diagnoses is counted as necessary and then the charge/discharge circuit 421, 422, ..., or 42N is determined as normal or the malfunction. In this configuration, it may be considered that the diagnosis circuit 48 substitutes a part of the function of the malfunction determination section 33 in the first and second embodiments. Alternatively, it may be considered that the diagnosis circuit 48 of the AD converter 403 and the malfunction determination section 33 of the CPU 301 collaborate to exert the function of the malfunction determination section. With this configuration, the same effect as the first embodiment and the second embodiment are achievable.

Other Embodiments

The number of input signals AN input to the AD converter 401, 402, or 403, that is, the number of signal input terminals may also be one, not plural.

The electric power steering system to which the signal control devices according to the present disclosure are applied is not limited to an electric power steering system that drives a three-phase AC brushless motor by an inverter, and may drive a DC motor by an H bridge circuit. In addition to the electric power steering system, the signal control device according to the present disclosure may be applied to any device that performs control arithmetic operation by an AD conversion of an input signal.

The present disclosure is not limited to the embodiments described above, and various modifications are employable within the scope of the present disclosure without departing from the spirit of the present disclosure.

What is claimed is:

1. A signal control device comprising:
a signal input terminal to which an input signal with a voltage value fluctuating within a predetermined fluctuation range is input from an input circuit;
a sampling capacitor having one end connected to the signal input terminal via an input signal path and another end connected to a reference potential;
a charge/discharge circuit including a charge path provided from a charge power supply end to a second connection point on the input signal path via a first connection point, a discharge path provided from the second connection point to a reference potential end via the first connection point, a charge switch capable of switching electrical connection and electrical disconnection between the charge path and the sampling capacitor and capable of charging the sampling capacitor when the charge path and the sampling capacitor are electrically connected, and a discharge switch capable of switching electrical connection and electrical disconnection between the discharge path and the sampling capacitor and capable of discharging the sampling capacitor when the discharge path and the sampling capacitor are electrically connected;
an AD conversion circuit performing an AD conversion by converting an analog voltage value charged in the sampling capacitor into an AD conversion value that is a digital value;
a switch control circuit operating the charge switch and the discharge switch; and
a malfunction determination section performing the AD conversion with the AD conversion circuit after performing a charge operation or a discharge operation to the sampling capacitor with the charge/discharge circuit, and determining a malfunction of the charge/discharge circuit based on a diagnosis result of the AD conversion value, wherein
the malfunction determination section individually performs at least one of a charge circuit check to diagnose the charge switch or the charge path and a discharge circuit check to diagnose the discharge switch or the discharge path,
in a case where the malfunction determination section performs the charge circuit check, the malfunction determination section performs the AD conversion after performing the charge operation by turning on the charge switch and turning off the discharge switch, and performs a charge diagnosis to diagnose as the malfunction when the AD conversion value is less than a lower limit threshold value, and
in a case where the malfunction determination section performs the discharge circuit check, the malfunction determination section performs the AD conversion after performing the discharge operation by turning on the discharge switch and turning off the charge switch, and performs a discharge diagnosis to diagnose as the malfunction when the AD conversion value is greater than an upper limit threshold value.

2. The signal control device according to claim 1, further comprising
an input interruption switch capable of electrically disconnecting the input signal path between the signal input terminal and the second connection point, wherein
the malfunction determination section determines the malfunction of the charge/discharge circuit in a state where the input interruption switch electrically disconnects the input signal path.

3. The signal control device according to claim 1, wherein
the malfunction determination section performs the discharge circuit check subsequently to the charge circuit check, or performs the charge circuit check subsequently to the discharge circuit check.

4. The signal control device according to claim 1, wherein
the malfunction determination section performs at least one of the discharge operation to the sampling capacitor before the charge circuit check or the charge operation to the sampling capacitor before the discharge circuit check.

5. The signal control device according to claim 1, wherein
in a case where the malfunction determination section performs the charge circuit check, when the malfunction determination section diagnoses as the malfunction by the charge diagnosis, the malfunction determination section performs the charge diagnosis again after performing the AD conversion again in a state where the charge operation is performed, and determines as the malfunction when a number of times diagnosed as the malfunction by the charge diagnoses reaches a malfunction diagnosis number threshold value, and in a case where the malfunction determination section performs the discharge circuit check, when the malfunction determination section diagnoses as the malfunction by the discharge diagnosis, the malfunction determination section performs the discharge diagnosis again after performing the AD conversion again in a state where the discharge operation is performed, and determines as the malfunction when a number of times diagnosed as the malfunction by the discharge diagnoses reaches a malfunction diagnosis number threshold value.

6. The signal control device according to claim 1, wherein in a case where the malfunction determination section performs the charge circuit check, when a result of the charge circuit check at a time is provisionally determined as the malfunction based on a result of one or more of the charge diagnoses, the malfunction determination section performs the charge circuit check again, and determines as the malfunction when a number of times provisionally determined as the malfunction by the charge circuit checks reaches a malfunction determination number threshold value, and in a case where the malfunction determination section performs the discharge circuit check, when a result of the discharge circuit check at a time is provisionally determined as the malfunction based on a result of one or more of the discharge diagnoses, the malfunction determination section performs the discharge circuit check again, and determines as the malfunction when a number of times provisionally determined as the malfunction by the discharge circuit checks reaches a malfunction determination number threshold value.

7. The signal control device according to claim 1, wherein the malfunction determination section performs both of the charge circuit check and the discharge circuit check as a series of checks, and in a case where a result of at least one of the charge circuit check and the discharge circuit check is provisionally determined as the malfunction, the malfunction determination section performs a series of the charge circuit check and the discharge circuit check again, and determines as the malfunction when a number of times provisionally determined as the malfunction by the charge circuit checks or the discharge circuit checks reaches a malfunction determination number threshold value.

8. A signal control device comprising:

a signal input terminal to which an input signal with a voltage value fluctuating within a predetermined fluctuation range is input from an input circuit;

a sampling capacitor having one end connected to the signal input terminal via an input signal path and another end connected to a reference potential;

a charge/discharge circuit including a charge path provided from a charge power supply end to a second connection point on the input signal path via a first connection point, a discharge path provided from the second connection point to a reference potential end via the first connection point, a charge switch capable of switching electrical connection and electrical disconnection between the charge path and the sampling capacitor and capable of charging the sampling capacitor when the charge path and the sampling capacitor are electrically connected, and a discharge switch capable of switching electrical connection and electrical disconnection between the discharge path and the sampling capacitor and capable of discharging the sampling capacitor when the discharge path and the sampling capacitor are electrically connected;

an AD conversion circuit performing an AD conversion by converting an analog voltage value charged in the sampling capacitor into an AD conversion value that is a digital value;

a switch control circuit operating the charge switch and the discharge switch; and a malfunction determination section performing the AD conversion with the AD conversion circuit after performing a charge operation or a discharge operation to the sampling capacitor with the charge/discharge circuit, and determining a malfunction of the charge/discharge circuit based on a diagnosis result of the AD conversion value, wherein the malfunction determination section performs a charge/discharge circuit simultaneous check in which a malfunction of the charge switch or the charge path and a malfunction of the discharge switch or the discharge path are simultaneously diagnosed, and in the charge/discharge circuit simultaneous check, the malfunction determination section performs the AD conversion in a state where both of the charge switch and the discharge switch are turned on, and diagnoses the charge/discharge circuit as the malfunction when the AD conversion value is out of a specified range.

9. A signal control device comprising:

a signal input terminal to which an input signal with a voltage value fluctuating within a predetermined fluctuation range is input from an input circuit;

a sampling capacitor having one end connected to the signal input terminal via an input signal path and another end connected to a reference potential;

a charge/discharge circuit including a charge path provided from a charge power supply end to a second connection point on the input signal path via a first connection point, a discharge path provided from the second connection point to a reference potential end via the first connection point, a charge switch capable of switching electrical connection and electrical disconnection between the charge path and the sampling capacitor and capable of charging the sampling capacitor when the charge path and the sampling capacitor are electrically connected, and a discharge switch capable of switching electrical connection and electrical disconnection between the discharge path and the sampling capacitor and capable of discharging the sampling capacitor when the discharge path and the sampling capacitor are electrically connected;

an AD conversion circuit performing an AD conversion by converting an analog voltage value charged in the sampling capacitor into an AD conversion value that is a digital value;

a switch control circuit operating the charge switch and the discharge switch;

a malfunction determination section performing the AD conversion with the AD conversion circuit after performing a charge operation or a discharge operation to the sampling capacitor with the charge/discharge circuit, and determining a malfunction of the charge/discharge circuit based on a diagnosis result of the AD conversion value; and a control arithmetic operation section performing a predetermined control arithmetic operation based on at least a part of the AD conversion value obtained by the AD conversion circuit, wherein the signal input terminal is one of a plurality of signal input terminals, and the charge/discharge circuit is one of a plurality of charge/discharge circuits corresponding to the plurality of signal input terminals, when the malfunction determination section determines one or more of the plurality of charge/discharge circuits as the malfunction, the control arithmetic operation stops usage of the AD conversion value corresponding to the charge/discharge circuit determined as the malfunction, and performs the predetermined control arithmetic operation using only the AD convention value corresponding to the charge/discharge circuit determined as normal.

10. The signal control device according to claim 1 configured to be applied to an electric power steering system that assists a steering torque of a driver with an output torque of an assist motor, wherein the input signal includes a steering torque signal and a feedback signal used for an output control of the assist motor.

* * * * *